(12) United States Patent
Pimpinella et al.

(10) Patent No.: US 11,528,442 B2
(45) Date of Patent: Dec. 13, 2022

(54) ADJACENT ELECTRODE WHICH PROVIDES PIXEL DELINEATION FOR MONOLITHIC INTEGRATION OF A COLLOIDAL QUANTUM DOT PHOTODETECTOR FILM WITH A READOUT INTEGRATED CIRCUIT

(71) Applicant: Sivananthan Laboratories, Inc., Bolingbrook, IL (US)

(72) Inventors: Richard Edward Pimpinella, Naperville, IL (US); Anthony Joseph Ciani, Palatine, IL (US); Christoph H. Grein, Wheaton, IL (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 195 days.

(21) Appl. No.: 16/726,047

(22) Filed: Dec. 23, 2019

(65) Prior Publication Data
US 2021/0195129 A1 Jun. 24, 2021

(51) Int. Cl.
*H04N 5/378* (2011.01)
*H01L 31/0352* (2006.01)
*H01L 27/146* (2006.01)
*H04N 5/3745* (2011.01)

(52) U.S. Cl.
CPC ....... *H04N 5/378* (2013.01); *H01L 27/14645* (2013.01); *H01L 27/14683* (2013.01); *H01L 31/035218* (2013.01); *H04N 5/3745* (2013.01)

(58) Field of Classification Search
None
See application file for complete search history.

(56) References Cited

U.S. PATENT DOCUMENTS

| 5,021,663 | A  | 6/1991  | Hornbeck |
| 5,196,703 | A  | 3/1993  | Keenan |
| 5,300,915 | A  | 4/1994  | Higashi et al. |
| 5,431,328 | A  | 7/1995  | Chang et al. |
| 5,512,748 | A  | 4/1996  | Hanson |
| 5,589,688 | A  | 12/1996 | Kimura et al. |
| 5,912,464 | A  | 6/1999  | Vilain et al. |
| 6,111,254 | A  | 8/2000  | Eden |
| 6,906,326 | B2 | 6/2005  | Koch et al. |
| 7,462,831 | B2 | 12/2008 | Gooch et al. |

(Continued)

OTHER PUBLICATIONS

International Searching Authority, International Search Report Of The International Searching Authority, dated Jun. 2021.

*Primary Examiner* — Nilufa Rahim
(74) *Attorney, Agent, or Firm* — Erickson Law Group, PC

(57) ABSTRACT

A photodetector device is provided that includes a ROIC having a top surface with a plurality of electrically conductive first electrodes within a pattern of surface areas on the top surface each surface area having a border, and an electrically conductive electrode grid having a portion on the border of each of the surface areas; and a photodetector film overlying the surface area. The electrode grid can be configured to surround each surface area to define the borders of the surface areas as pixels. The photodetector film can be a colloidal quantum dot film. The ROIC has circuit elements signal-connected to the plurality of first electrodes. Methods for forming the photodetector device include photolithography and deposition methods.

9 Claims, 26 Drawing Sheets

(56) References Cited

U.S. PATENT DOCUMENTS

| | | | |
|---|---|---|---|
| 7,742,322 B2 | 6/2010 | Sargent et al. | |
| 7,746,681 B2 | 6/2010 | Sargent et al. | |
| 7,881,091 B2 | 2/2011 | Sargent et al. | |
| 8,023,306 B2 | 9/2011 | Sargent et al. | |
| 8,054,671 B2 | 11/2011 | Sargent et al. | |
| 9,209,331 B2 | 12/2015 | Ivanov et al. | |
| 9,373,736 B2 | 6/2016 | Sargent et al. | |
| 9,410,850 B2 | 8/2016 | Novotny et al. | |
| 10,879,289 B1* | 12/2020 | Lin | H01L 21/30604 |
| 2006/0046204 A1 | 3/2006 | Ono et al. | |
| 2011/0309236 A1 | 12/2011 | Tian et al. | |
| 2012/0267737 A1* | 10/2012 | Chen | H01L 27/14683 |
| | | | 438/93 |
| 2017/0069679 A1 | 3/2017 | Sargent et al. | |
| 2021/0225918 A1* | 7/2021 | Lin | H01L 27/14689 |
| 2021/0288195 A1* | 9/2021 | Klem | H01L 27/1446 |

* cited by examiner

ADJACENT ELECTRODE WHICH PROVIDES PIXEL DELINEATION FOR MONOLITHIC INTEGRATION OF A COLLOIDAL QUANTUM DOT PHOTODETECTOR FILM WITH A READOUT INTEGRATED CIRCUIT

STATEMENT REGARDING FEDERALLY SPONSORED RESEARCH OR DEVELOPMENT

This invention was made with government support under US Government contracts: W911SR-14-C-0048 awarded by Department of Defense (Chemical and Biological Defense Command); and D15PC00007 awarded by Department of Defense (Defense Advanced Research Projects Agency). The government has certain rights in the invention.

TECHNICAL FIELD OF THE INVENTION

This invention generally relates to photodetectors useful in cameras and camera systems and other devices useful in detecting photons or other electromagnetic radiation. Particularly, the invention relates to electrodes used in photodetectors that include both a photodetector film, such as a colloidal quantum dot film, and a readout integrated circuit.

BACKGROUND OF THE INVENTION

Certain materials, material systems, material composites and material structures known collectively as photosensors or photodetectors are capable of producing a detectable change in electrical signal(s), such as a current or changing conductance, when light or waves of electromagnetic radiation are intercepted by the photodetector. A photodetector often comprises a structure consisting of a conductive cathode, a photoconductive material or photovoltaic junction, and an anode. Electronic detection of photons is accomplished by applying an electrical bias voltage or electric field between the two electrodes (anode and cathode) of a photodetector, measuring the signal apparent in the photodetector and relating that signal to the intensity of the electromagnetic radiation incident on the detector. Further information of such photodetectors may be found in U.S. Pat. Nos. 5,912,464; 6,111,254; 5,300,915; 5,021,663; 5,512,748; and 5,589,688.

One such type of photodetector is a colloidal quantum dot (CQD) film. These films are aggregates of material known as quantum dots, which are particles on the scale of a few nanometers that were suspended in a liquid as a colloid before being treated, deposited, and then bonded to the deposition target substrate.

These quantum dots possess quantized allowable energies for electron states within each dot. Due to each dot's restricted physical size, these energy states may not represent those present in the same materials in bulk form due to quantum confinement. When a photon is intercepted by such a dot, it may be absorbed and excite an electron into another allowable quantum state within the dot. This excited electron may then move from its origination dot to any other dot in the film even if classically forbidden via quantum mechanical tunneling, with a very strong preference for those in immediate physical proximity. Excited electrons within a material in contact with conductive electrodes may then transit from the film and follow the new electrode path. When applying an external electric field or bias through the CQD film, one can create preferred directions for this tunneling behavior and thus create an observed change in film conduction when many such excited electrons are present due to the exciting electromagnetic radiation, and thus radiation is detected. Further information on CQD films as photodetectors may be found in U.S. Pat. Nos. 7,746,681; 6,906,326; 7,742,322; 8,023,306; 7,881,091; 9,373,736; 8,054,671; and 9,209,331.

Imaging devices are then assembled from a one, two or three-dimensional array of any such photodetectors. These photodetectors may be in electrical contact with a grid of photodetector sites known as pixels with their own electrical contacts which in turn are connected to auxiliary electronics such as amplifiers and then can be individually addressed. The physical pixel electrodes, the addressing scheme, auxiliary electronics, pixel definition, pixel density, pixel size, data read speed, analog to digital conversion, electron well capacity, dynamic range and other electronic behaviors are known collectively within the framework of a readout integrated circuit ("ROIC"). Further information of such ROICs may be found in U.S. Pat. Nos. 9,410,850; 5,431, 328; 7,462,831; and 5,196,703.

In a typical imaging array, each photodetector has its own preamplifier, and each preamplifier is connected to address logic and output amplifiers, such that the signal current can be measured at each photodetector and its value communicated to subsequent electronic systems. The array of analog and digital circuitry that measures and communicates the current from each photodetector in the array can be, and is often contained in an ROIC, which is fabricated on a wafer separately from the photodetector array. There exist many possible embodiments for the electronics and methods present within a ROIC, and geometries for the array of photodetectors; however, many ROICs designed for hybridization possess an anode and a cathode for each photodetector in the array. At each photodetector location (pixel), one or more electrodes may be present, depending on the number of co-located photodetectors.

These ROICs are subsequently placed in contact with an accompanying grid of photodetectors. This contact can originate in various ways such as: physical contact between the two pixel grids through an interposing conductive contact soft metal such as Indium; through direct deposition of the photodetectors upon the ROIC and possible subsequent pixel definition through chemical, mechanical or optical etching; or other means not listed here. Each technique has limitations and difficulties in use as well as various cost and complexity issues. Pixel definition in CQD films is previously accomplished using an etching process in which a deposited film is chemically or physically etched into pixel regions. When a ROIC is placed in contact and bonded to a photodetector array of dissimilar material, the process is called hybridization. The resulting product of the photodetector array bonded to the ROIC is known collectively as a focal plane array (FPA), as this is the detection array which will be present on the focal plane of the optics assembly of any subsequent imaging system.

Many commercially available ROICs are generally designed for hybridization with photodetector arrays that already possess the common conduction pathways, either through the substrate wafer on which they were fabricated or through conductive channels formed as part of the fabrication process. Many traditional semiconductor-based detectors are manufactured through multiple process steps and then subsequently hybridized to the ROIC. Other photodetector materials and material systems such as CQD detectors can be deposited as a uniform film across the surface of a ROIC in as little as one process step, and therefore lack the internal structures necessary to channel the common current to each pixel.

The present inventors have recognized that this presents a challenge for these material systems to have proper pixel definition, electrical conduction, and subsequent electrical signal detection in the presence of electromagnetic radiation.

The present inventors have recognized that a need exists for a cost effective method to produce a photodetector.

The present inventors have recognized that a need exists for a cost effective method to produce a CQD film photodetector.

SUMMARY

This exemplary embodiment of the invention provides an electrode grid used in monolithic integration of a photodetector film through a modification of readout integrated circuits which digitize signals from photodetectors sensitive to infrared wavelengths of electromagnetic radiation, or other types of electromagnetic radiation, and more particularly those photodetectors comprised of colloidal quantum dot films prepared in solution.

An adjacent electrode is produced which is used to provide electrical contact and pixel delineation upon a commercially available readout integrated circuit (ROIC) prior to any deposition of a photosensitive absorbing film or "photodetector film." The electrode grid provides for a monolithic integration with the ROIC. This grid conducting line(s) or electrode(s) are added to the ROIC die or wafer of dies, possessing the same basic geometry as the layout of the pixel sites or a geometry compatible with the layout of the pixel sites defined by the ROIC. The photosensitive absorber or photodetector may be illuminated either from the front away from the ROIC or through the backside of the ROIC. Furthermore, the electrode materials need not be transparent to the targeted electromagnetic radiation wavelengths.

The exemplary embodiment of the invention includes a host ROIC having a plurality of pixel areas arranged in a pattern, wherein each pixel area has a first pixel electrode and a second pixel electrode adjacent to or on the border of each pixel area, and an overlying photodetector film. The second pixel electrode can be provided by an electrode grid having a portion near each pixel on the host ROIC.

This electrode grid may come in a variety of forms, including a grid having a pattern comprising repeating squares, stripes, rings, hexagons, or any other such shape which is either spaced from, or surrounds each pixel electrode on the host ROIC. The electrode grid may also be of high or low aspect ratio comparing its relative width to distance above the host ROIC, and may be of any suitable geometry in cross section such as rectangular, pyramidal, rounded, beveled, or otherwise shaped. In order to achieve better imaging performance, the grid should have the same basic geometry as the arrangement of the pixels, but it need not surround every pixel.

The plurality of pixel electrodes on the host ROIC are spaced apart and arranged in a pattern, one within each pixel area. Proper electrical voltage biasing of the photodetector film, such as one prepared with CQDs, hereafter referred to as the CQD film, will require two electrodes. The pixel electrodes provide a first electrode and the electrode grid provides a second electrode for each pixel. This electrode grid should not intersect any pixel electrode on the ROIC, or the CQD film in that region will not be under an electrical voltage bias. This electrode grid however can be in contact with an ROIC's common contact to provide proper functionality with the ROIC.

The electrode grid can separate each area of the CQD film into areas in which intercepted photons near the pixel electrode of the ROIC will generate an electrical signal in that proximity and such current will flow between the electrode and the electrode grid at the pixel site. Thus, the electrode grid provides direct pixel definition on the CQD film without etching or post-deposition processing.

Such an electrode grid may be formed from any electrically conductive substance, such as metals, metal alloys, or any material or combination of materials with a high electron or hole mobility. The electrode grid may be composed of a conducting material such as gold, copper, aluminum, titanium, indium tin oxide, or any other conducting compound or element or combination thereof that can be deposited onto the host ROIC, using any lithography or deposition processes that is compatible with the ROIC. A compatible process will have no or negligible negative impact to the performance, operation or longevity of the ROIC, and a conducting material shall have conductivity sufficient to carry the electrical signals of the detector array when deposited. The electrode grid may be shaped by using any lithography or masking process suitable for use with the deposition technique, and the deposition technique may be any technique, in practice or yet envisioned, that can deposit the conducting material onto the ROIC in the form of the grid. Exemplary methods of forming the electrode grid according to the invention are described herein. The electrode grid may be deposited over an entire wafer of ROICs, or a section cut from such a wafer.

An ROIC which is suitable for this modification would be capable of applying an electrical voltage bias to the subsequently deposited photosensitive absorber (photodetector film) through one or more electrodes located at each pixel site and an electrode or set of electrodes common to all pixels.

After the electrode grid has been deposited on the host ROIC, a photodetector film, such as one formed with CQDs, is deposited upon the ROIC and the electrode grid. The photodetector film may be composed of a variety of chemical compounds or elements. The photodetector film may be of suitable size to absorb at the chosen wavelength of electromagnetic radiation, and may be deposited with any method suitable for the formation of such a film, including, but not limited to: spin coating, dip coating, drop casting, or printing. The photodetector film may be formed using any chemical formulation suitable to the deposition and formation of the film, including suspension in polar or non-polar suspending fluids, the use of organic or inorganic ligands, and post-deposition physical or chemical processes to modify the structure of chemistry of the film. The photodetector film may be formed across the entire wafer or ROICs, part of such wafer, on an isolated ROIC or on an ROIC already mounted to its carrier. The photodetector film may be masked to cover only a portion of the available active area of the imaging array. The photodetector film may be removed from areas of the ROIC post-deposition to assure such electrical isolation if desired.

According to the exemplary embodiment of the invention: 1) electrical signals can more readily flow between sensing electronics and the CQD film which has generated electrons in response to detected photons; and 2) pixels can be defined and addressed in the CQD film without the need of further device processing to electrically isolate areas in the CQD film near the ROIC's pixel electrodes.

Numerous other advantages and features of the present invention will become readily apparent from the following detailed description of the invention and the embodiments thereof, from the claims, and from the accompanying drawings.

DETAILED DESCRIPTION OF THE PREFERRED EMBODIMENT

Figure 1:
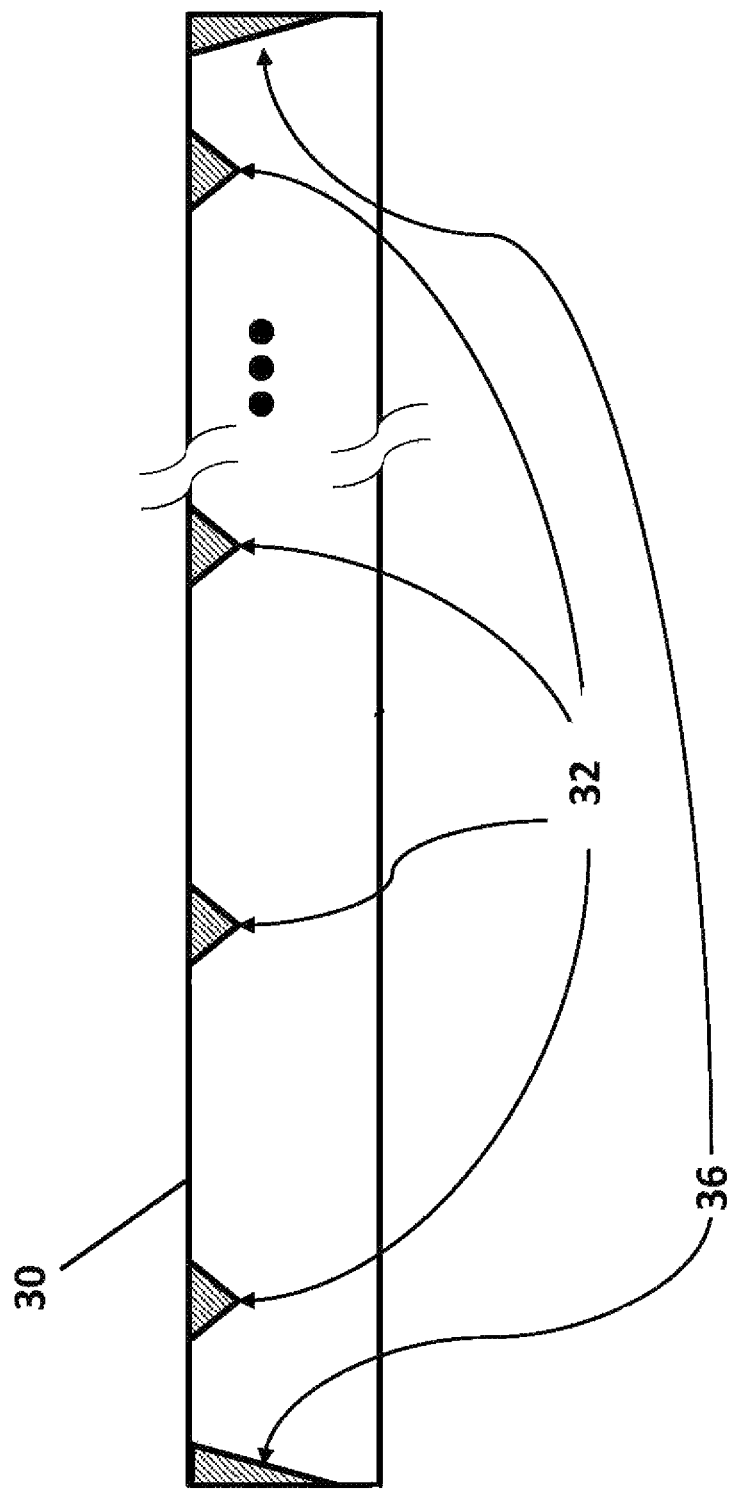
FIG. 1 is a sectional view of a ROIC to be processed in accordance with an exemplary method of the invention.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

Exemplary methods according to the invention provide for an adjacent "electrode" or "contact" for an array of photodetectors, and for the fabrication of the array of photodetectors upon a host ROIC. This adjacent electrode could be formed in a variety of ways using present day techniques, or new techniques as of yet unforeseen. The exemplary methods are described in FIGS. 1-26. The resultant product of the methods is shown in FIGS. 13 and 14.

Figure 13:
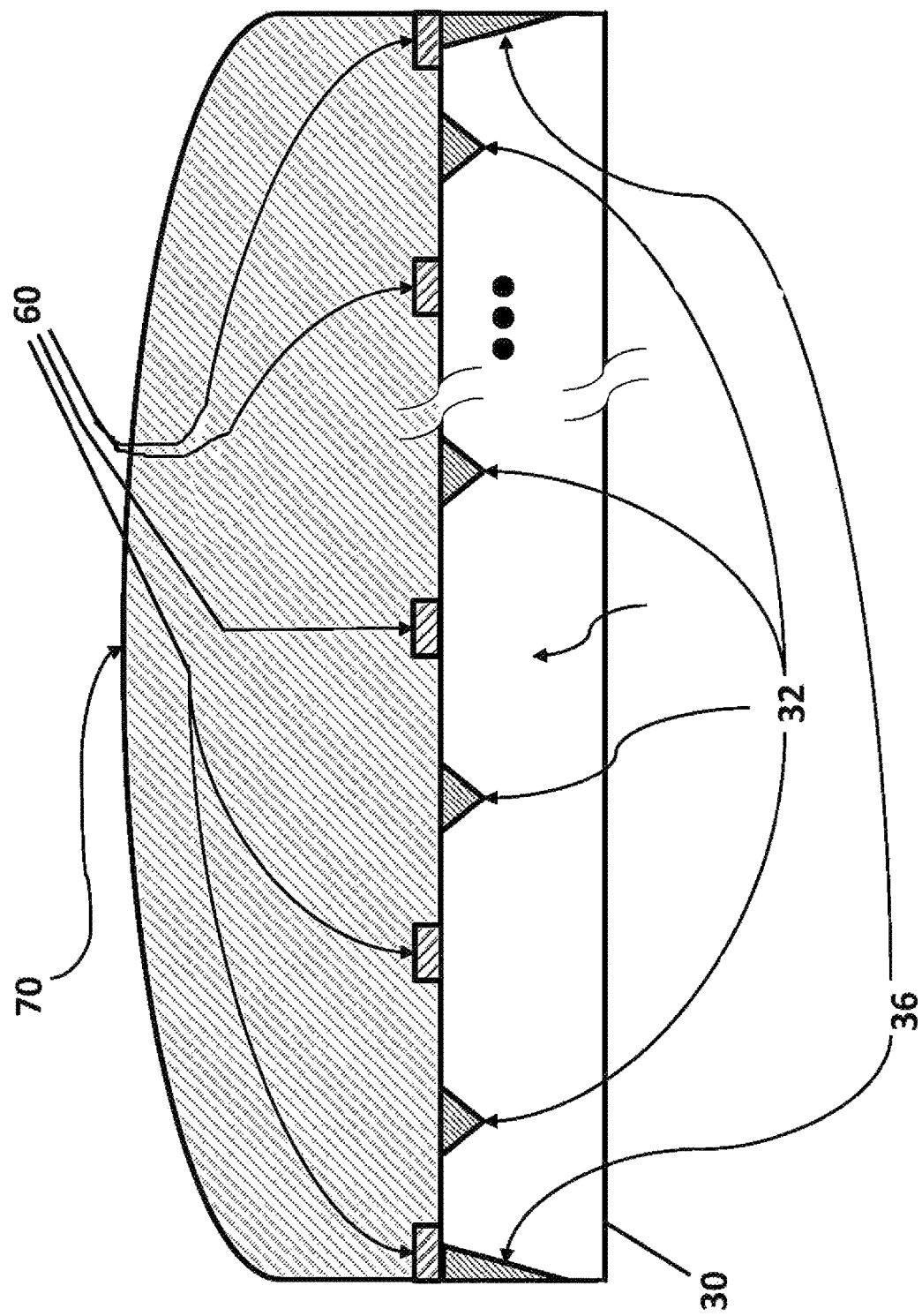
FIG. 13 is a sectional view of the ROIC of FIG. 11 with an overlying photodetector film having been applied after a sixth step of the exemplary method of the invention.
Figure 14:
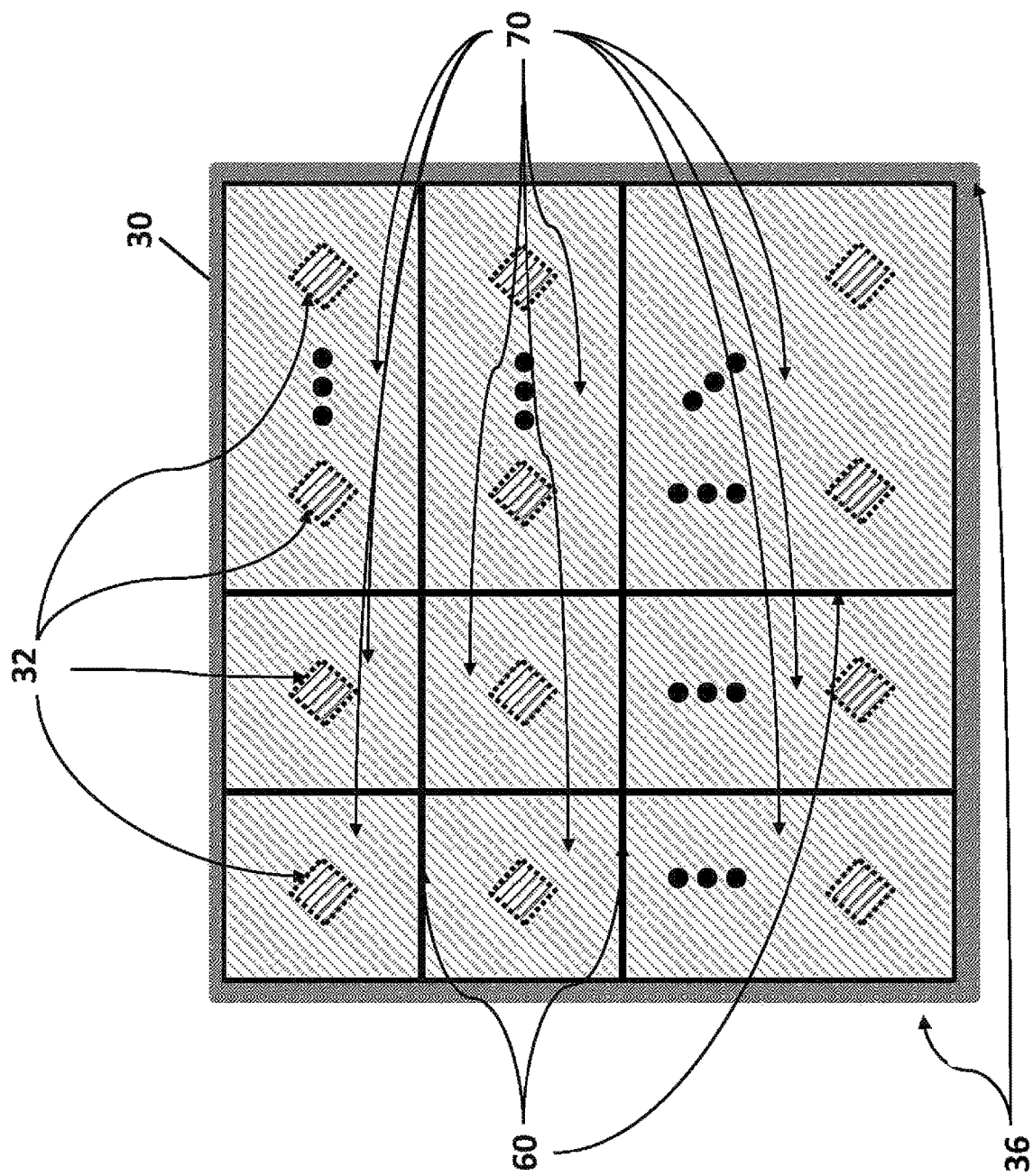
FIG. 14 is a plan view of the ROIC of FIG. 13.

Referring first to FIGS. 13 and 14, an ROIC 30 has a plurality of pixel "electrodes" or "contacts" 32, an "electrode" or "contact" grid 60, and a common contact 36, all formed on the host ROIC material. An overlying photodetector film 70 covers the ROIC 30, the electrodes 32, the grid 60, and the common contact 36. The electrode grid 60 can delineate pixels on the ROIC. As shown in FIGS. 13 and 14, and throughout the Figures, three black dots aligned in a line are shown as a symbol of a repeating pattern, arranged horizontally (in the plane of the page) to indicate a horizontal (in the plane of the page) repeating pattern, vertically (in the plane of the page) to indicate a vertical (in the plane of the page) repeating pattern, and diagonally to indicate both a horizontal and vertical repeating pattern (in the plane of the page).

The plurality of pixel electrodes 32 are arranged spaced apart in a repeating pattern, with one pixel electrode at each pixel location. Proper electrical voltage biasing of the photodetector film, such as a CQD film, requires two electrodes, the electrodes 32 provides the first electrode and the electrode grid 60 provides the second electrode. This grid 60 should not intersect any electrode 32 on the ROIC, or the CQD film in that region will not be under an electrical voltage bias. This electrode grid 60 can be in contact with the ROIC's common contact 36 located around the edge of the ROIC 30, to provide proper functionality with the ROIC.

The photodetector film 70 may be composed of a variety of chemical compounds or elements. The photodetector film may be of suitable size to absorb at the chosen wavelength of electromagnetic radiation. The film may be formed across the entire wafer of the ROIC, part of such wafer, on an isolated ROIC or on an ROIC already mounted to its carrier. The film 70 may be masked to cover only a portion of the available active area of the imaging array. The film 70 may be removed from areas of the ROIC 30 post-deposition to assure such electrical isolation if desired.

The electrode grid 60 separates each area of the CQD film 70 into areas in which intercepted photons near each pixel electrode 32 of the ROIC will generate an electrical signal in that proximity, and such current will flow between the pixel electrode 32 and the electrode grid 60 at the pixel site. The grid provides direct pixel definition of the CQD film without etching or post-deposition processing. The probability that a photon intercepted at one delineated pixel site has its related electrical signal detected at another pixel site (known as cross-talk) is also greatly diminished. This is because any such photon-generated signal current must now transit through the CQD film 70 in opposition to the applied voltage bias of the desired pixel in order to be instead detected at the adjacent pixel.

Such a grid 60 may be formed from any electrically conductive substance, such as metals, metal alloys, or any material or combination of materials with a high electron or hole mobility. The common grid may be composed of a conducting material such as gold, copper, aluminum, titanium, indium tin oxide, or any other conducting compound or element or combination thereof that can be deposited onto the host ROIC. The conducting material shall have conductivity sufficient to carry the electrical signals of the detector array when deposited.

With the newly prepared ROIC 30 with the photodetector CQD film 70 deposited thereon, the formation into a focal plane array ("FPA") may take place. This method will provide electrical interfacing between the ROIC and external frame-grabbing hardware and the integration of the optical pathway into a full camera system.

Example 1

One such process to fabricate an adjacent electrode grid in preparation for a photodetector film is described below. This method will be broken into 3 primary steps each with listed sub-steps: 1) definition of electrode areas via photolithography, 2) development of electrode areas via developer solution, 3) deposition of a conductive layer and subsequent removal of excess photoresist. It is preferred that listed steps be performed in an ISO Class 10/100 or superior clean room environment.

Figure 2:
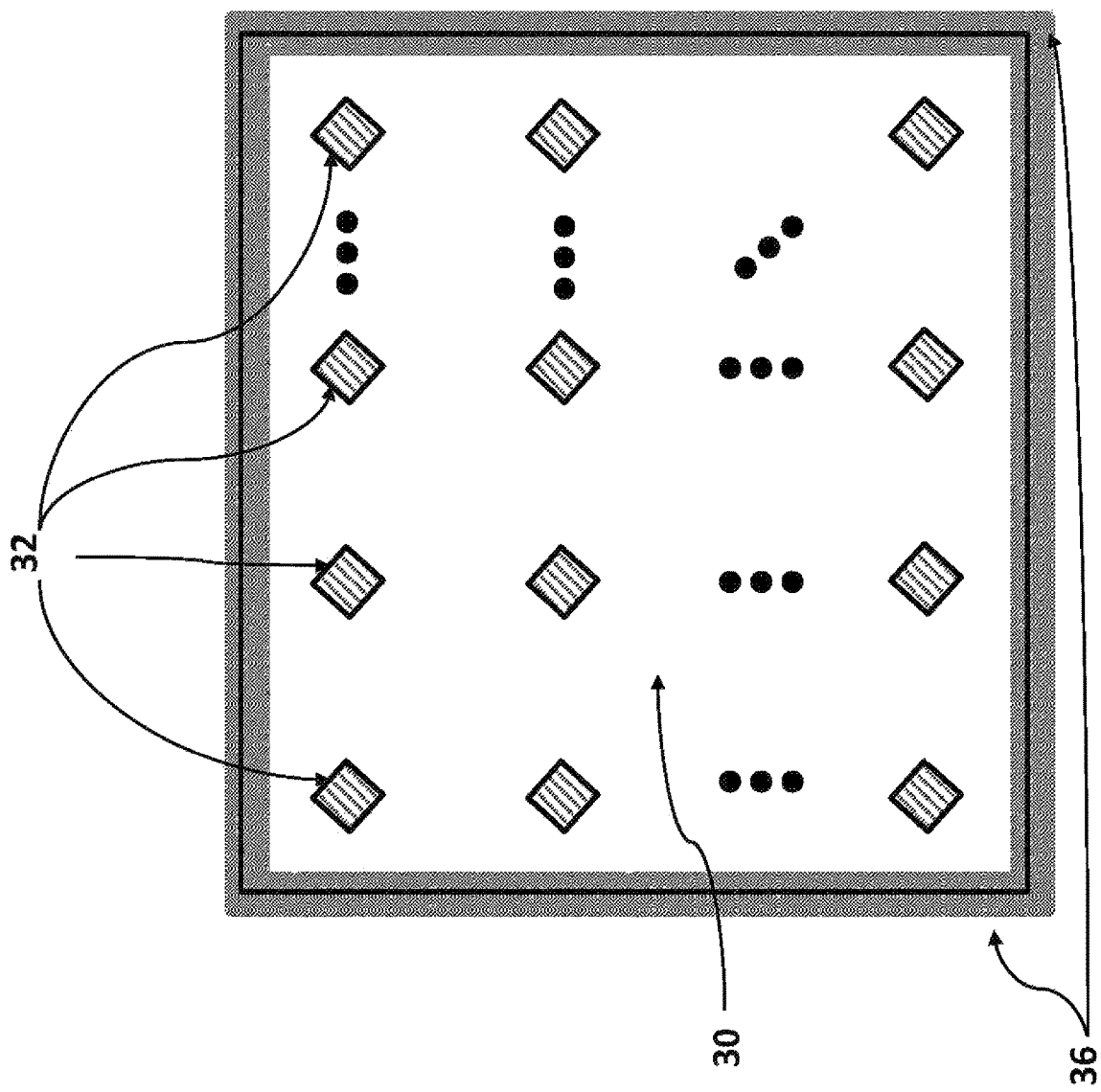
FIG. 2 is a plan view of the ROIC of FIG. 1.

Step 1: Definition of Electrode Areas Via Photolithography 1.1 An ROIC 30 is provided as a starting workpiece, configured as shown in FIGS. 1 and 2. The ROIC 30 supports desired electrical behaviors for the photodetector array to which it will be in signal contact. The ROIC includes the pixel electrodes 32 that are spaced over the ROIC in a pattern, such as in a grid configuration. The pixel electrodes 32 are signal-connected to circuitry of the ROIC (not shown). The common electrical contact 36, shown in the shape of a rectangle, is placed as an outer perimeter contact of the ROIC 30. The common contact 36, which may be a ground contact, is signal-connected to circuitry of the ROIC (not shown). The ROIC 30 first undergoes a cleaning process with suitable solvent chemicals or other methods which strip away contaminants but leave the ROIC undamaged, for example: Acetone, Methanol, Isopropyl Alcohol, or the like. Such a contamination clean may also be performed using a plasma etch, or any other technique which leaves the ROIC undamaged.

Figure 3:
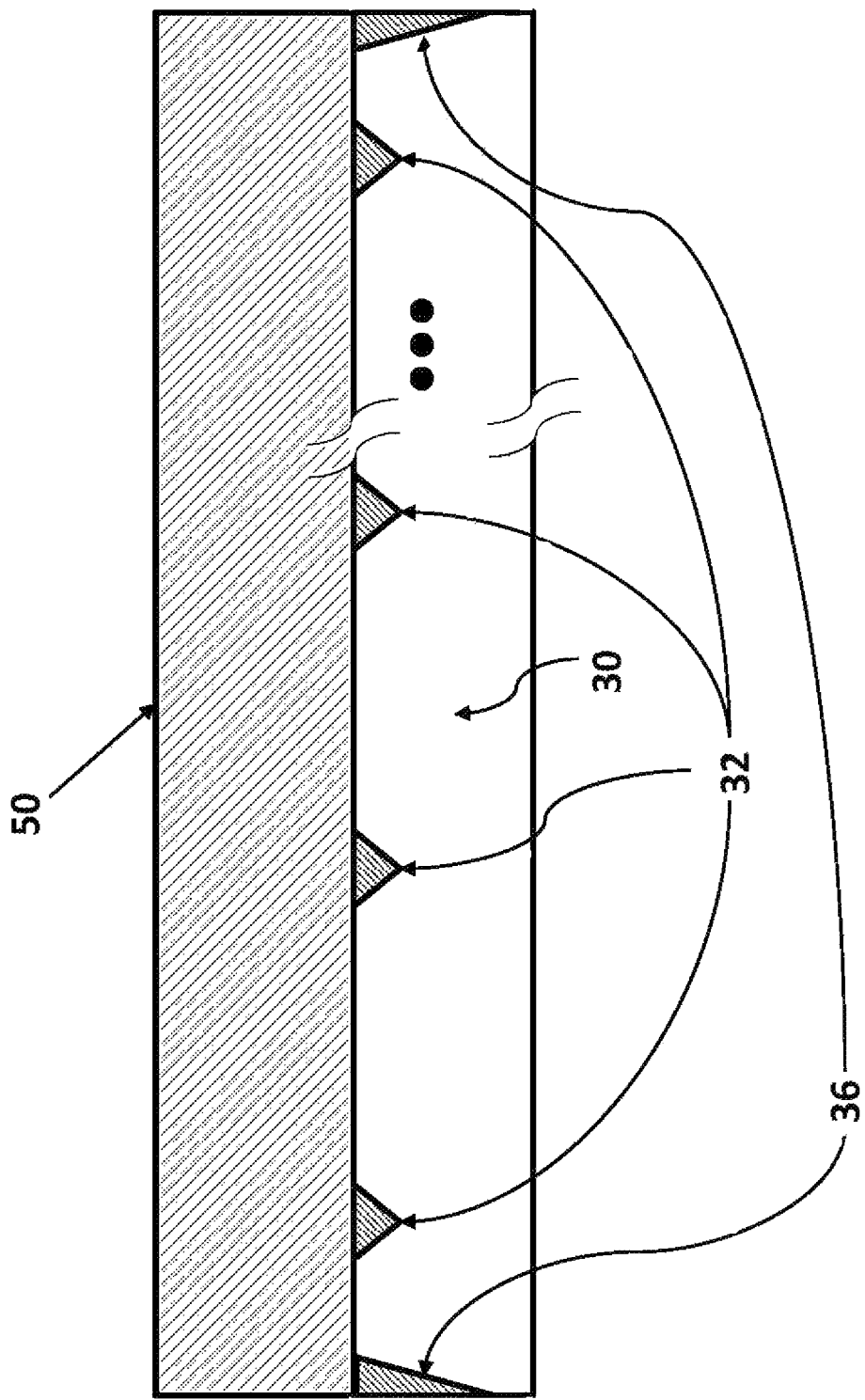
FIG. 3 is a sectional view of the ROIC of FIG. 1 after a first step of the exemplary method of the invention.
Figure 4:
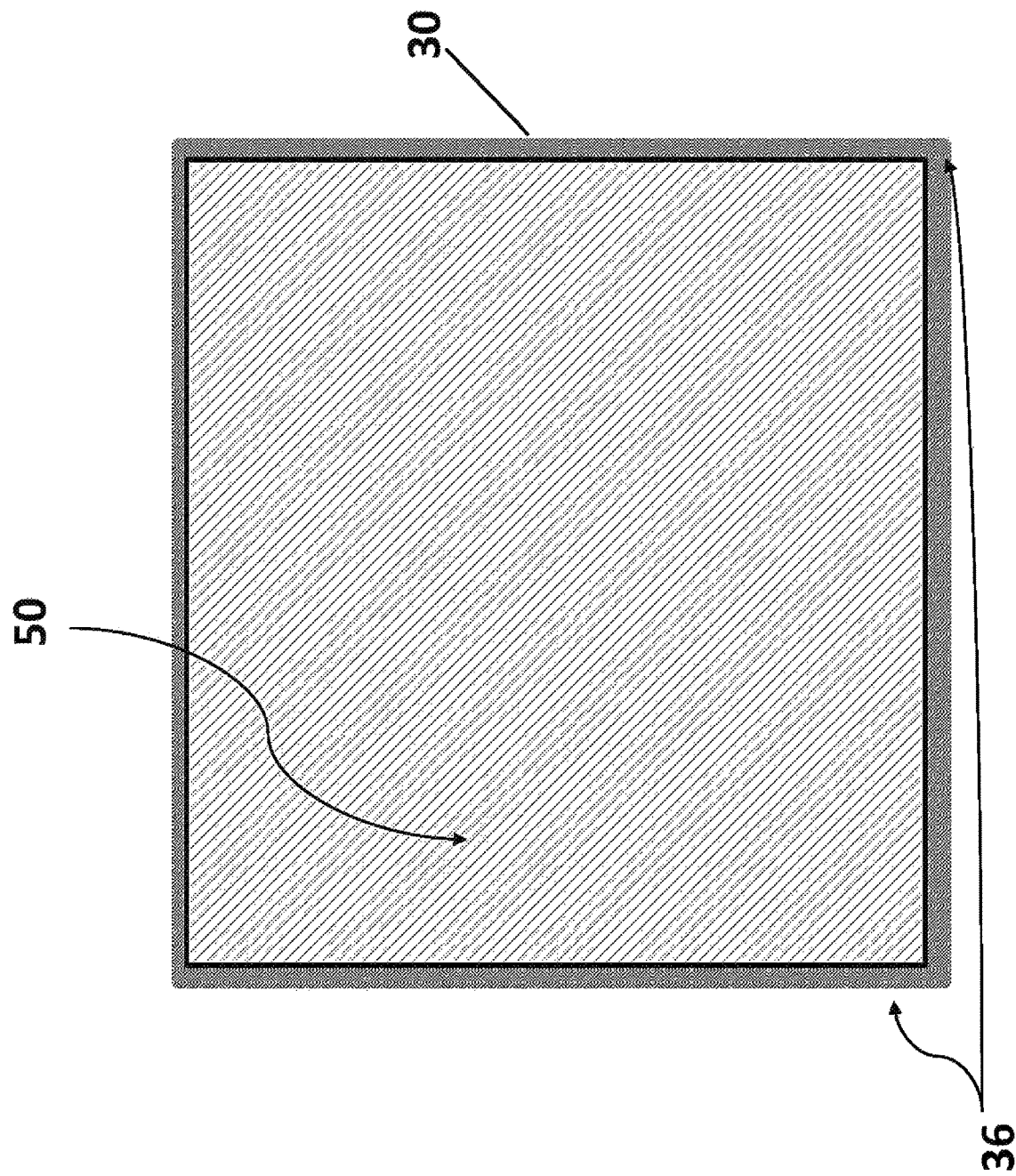
FIG. 4 is a plan view of the ROIC shown in FIG. 3.

1.2 Next, as shown in FIGS. 3 and 4, a photo-responsive polymer such as a polyimide plastic, or positive or negative photoresist, such as NR71, hereafter referred to as the photoresist 50 is deposited uniformly onto a top surface of the host ROIC 30. Uniform deposition can be performed using a spin coating at or near 4000 revolutions per minute at or near a 30 second duration. Any other technique which deposits such photoresist 50 in a uniform manor would be suitable.

1.3 Next, this ROIC 30 with photoresist 50 can be given a short term thermal anneal at or near 145° C. at or near a 60 second duration, otherwise known as a 'soft bake'. Other temperatures or durations which prepare the photoresist for light exposure will also be suitable.

Figure 5:
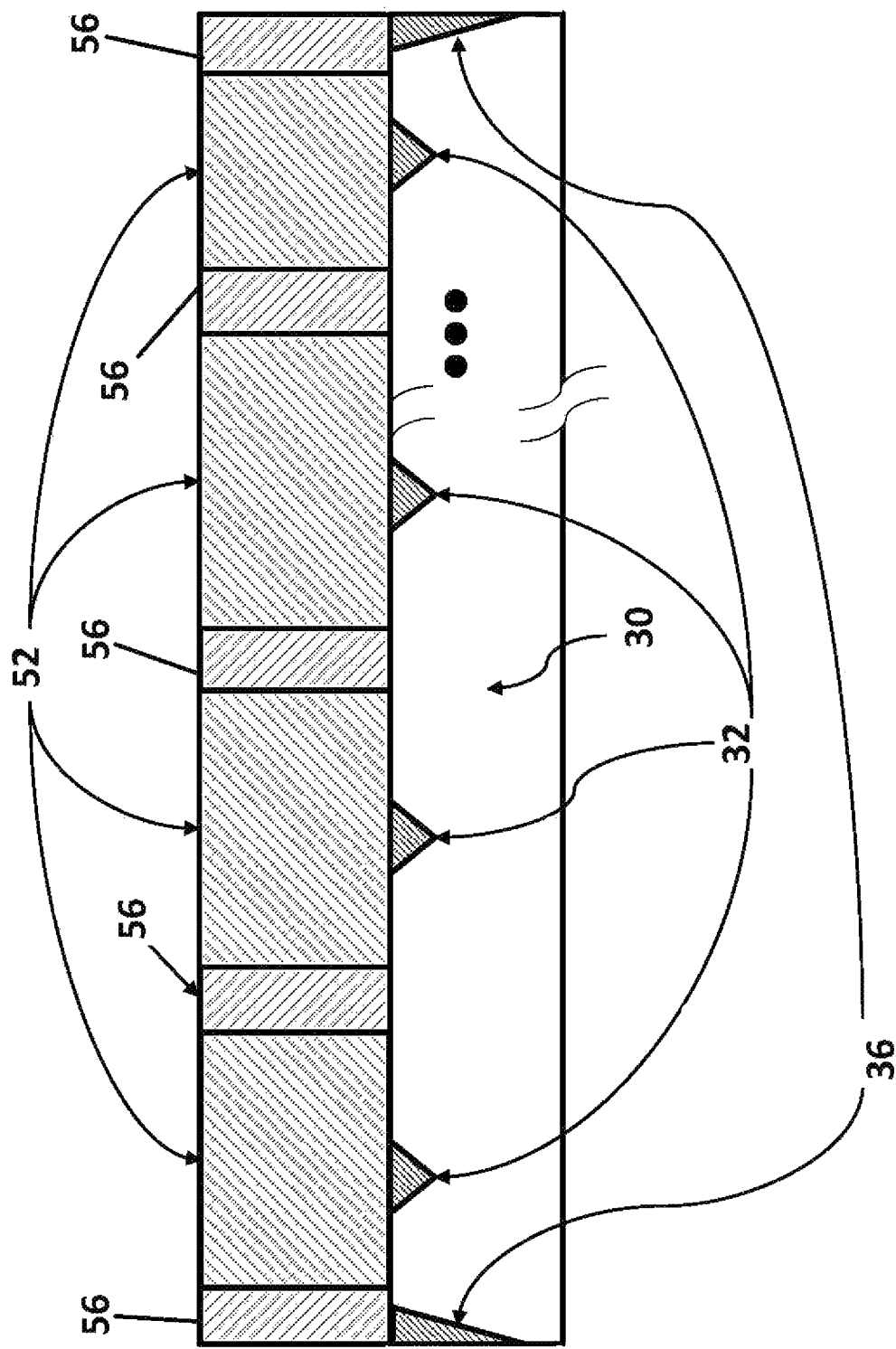
FIG. 5 is a sectional view of the ROIC of FIG. 3 after a second step of the exemplary method of the invention.
Figure 6:
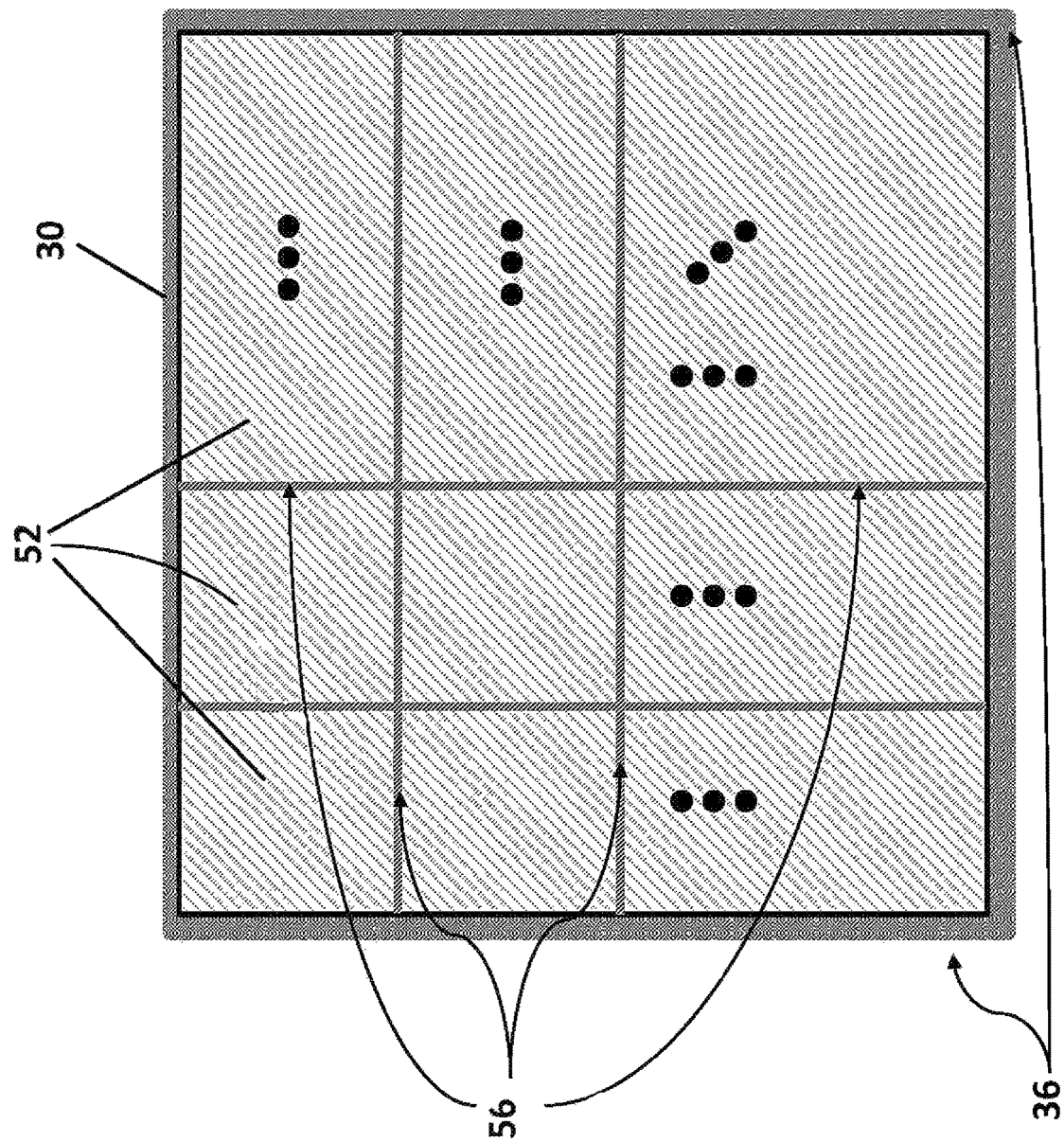
FIG. 6 is a plan view of the ROIC of FIG. 5.

1.4 As described in FIGS. 5 and 6, an appropriate photolithography mask (not shown) is placed in a desired alignment over the photoresist 50. The mask has a pattern to define an electrode grid using the desired geometry, and is matched to the photoresist chosen (negative or positive photoresist). For example: for a grid having square pixels and using negative photoresist, the photo-mask will provide light exposure to only a square area 52 covering pixel electrode 32, and does not expose a square grid shape 56 around each pixel electrode 32.

1.5 After alignment on the top surface of the photoresist on the ROIC 30, the photolithography mask is placed in close proximity to an ultraviolet light source.

1.6 The photoresist 50 is exposed to ultraviolet light for a duration at or near 30 seconds. Depending on the choice for photoresist, other such treatments may be applied at this time which prepare the photoresist for subsequent removal and definition. For example, for a negative photoresist, UV exposure for 30 seconds will strengthen the polymers exposed, such as in the square areas 52, allowing the unexposed areas square grid areas 56 to be safely removed in subsequent steps.

1.7 After exposure, the host ROIC 30 and photoresist 50 are given a second thermal anneal, now at a temperature at or near 100° C. and at or near 60 second duration, known as a "hard bake." Any other preparation process suitable for the chosen photoresist will be performed at this time which prepares the photoresist to be removed in subsequent steps.

Step 2: Development of Electrode Areas Via Developer Solution.

Figure 7:
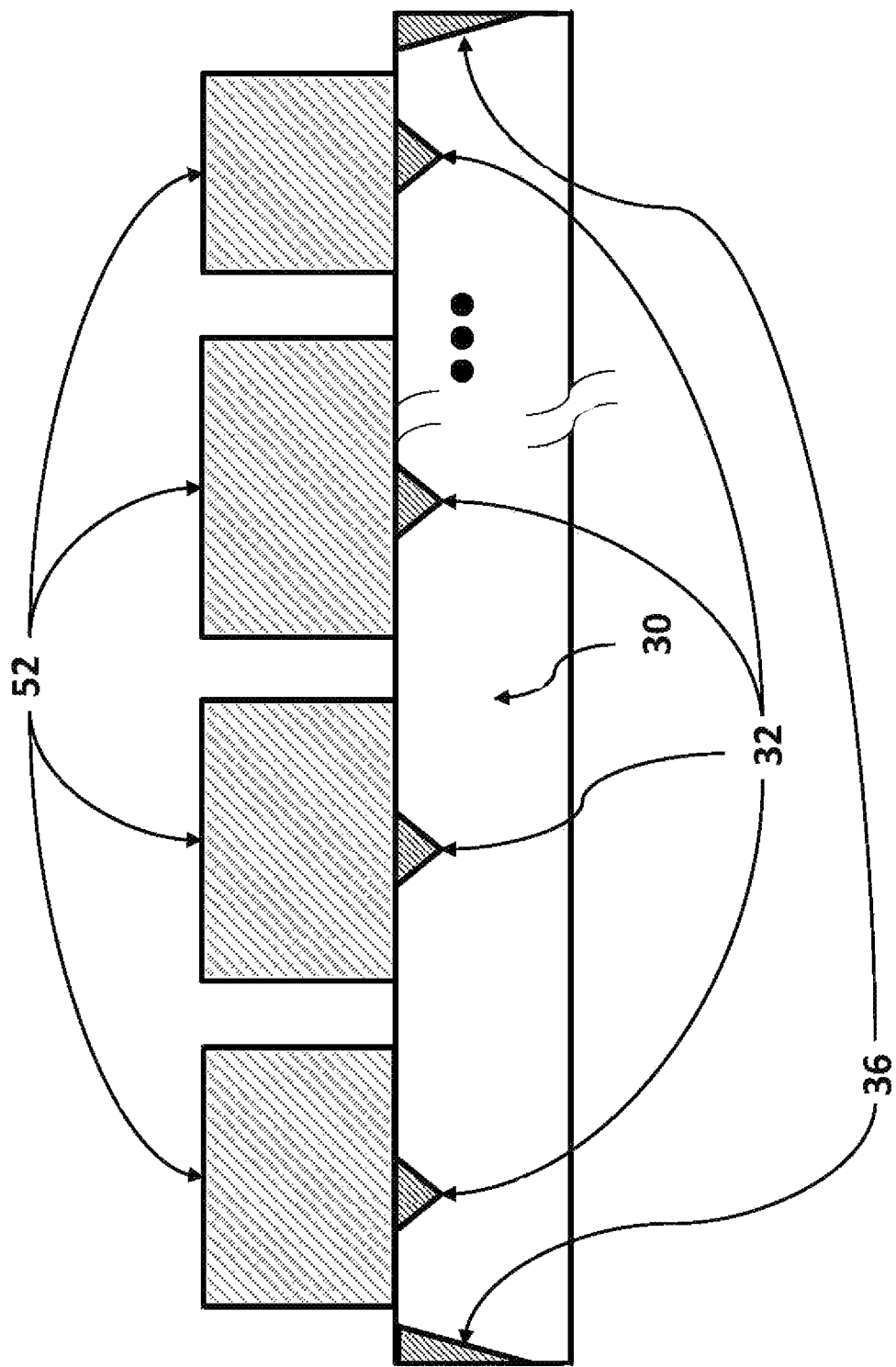
FIG. 7 is a sectional view of the ROIC of FIG. 5 after a third step of the exemplary method of the invention.
Figure 8:
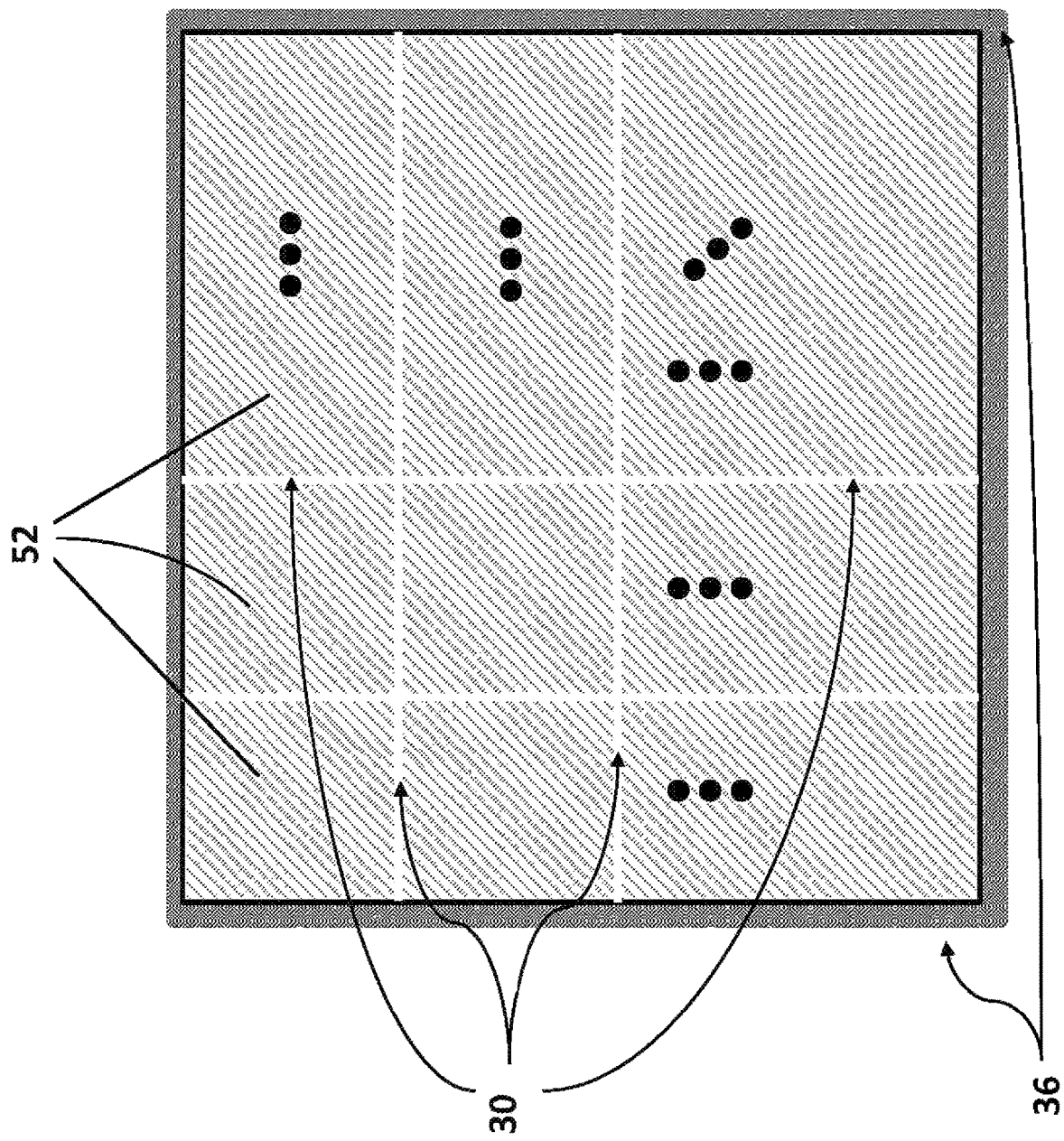
FIG. 8 is a plan view of the ROIC of FIG. 7.

2.1 The prepared host ROIC from Step 1 is immersed completely in a suitable development solution such as RD6 for a duration at or near 60 seconds or until such time as the photoresist is fully developed. As shown in FIGS. 7 and 8, this removes the unexposed areas 56 of the photoresist that define the eventual areas of the electrode grid 60.

2.2 Two pure de-ionized water solutions are prepared, and the host ROIC is immersed within the first solution and possibly lightly agitated. Then it is transferred to the second de-ionized water solution and again lightly agitated, providing a cleaning process.

2.3 After cleaning, the host ROIC is dried through flowing gaseous nitrogen of suitable purity to avoid contamination. Any such process to remove unwanted and excess water may be used here providing that the host ROIC is not damaged, nor the defined areas from previous steps removed.

2.4 The host ROIC is now optionally inspected for damage and proper exposure. It is at this stage combinations of any previous steps may be performed following any re-processing or chemical etching to removed unwanted areas. For example, if unexposed areas 56 appear to not have had a long enough duration to properly define the electrode grid, the photoresist may be removed through a method as in step 1.1 and subsequent steps from 1.2 to 2.3 may be performed again.

Figure 9:
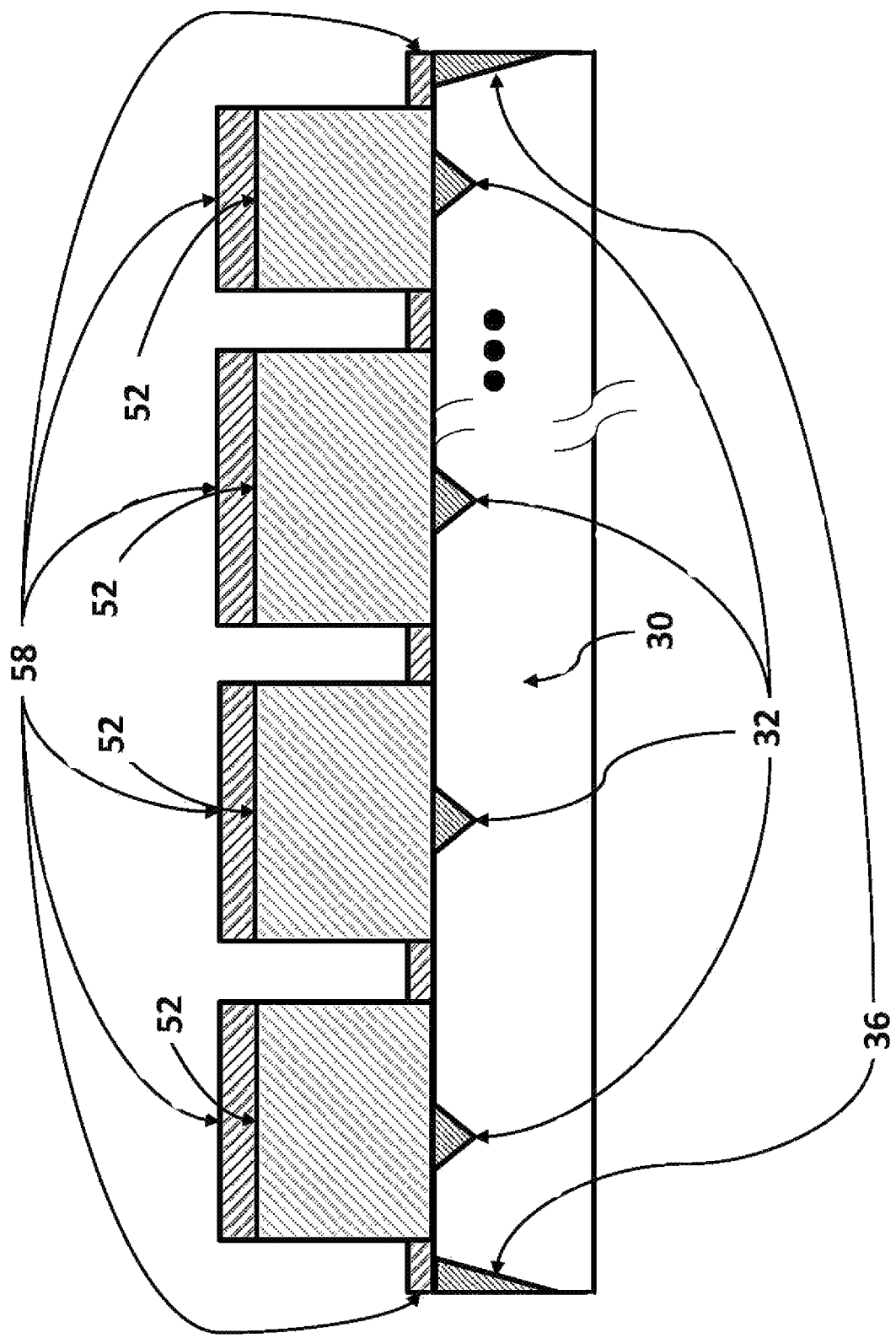
FIG. 9 is a sectional view of the ROIC of FIG. 7 after a fourth step of the exemplary method of the invention.
Figure 10:
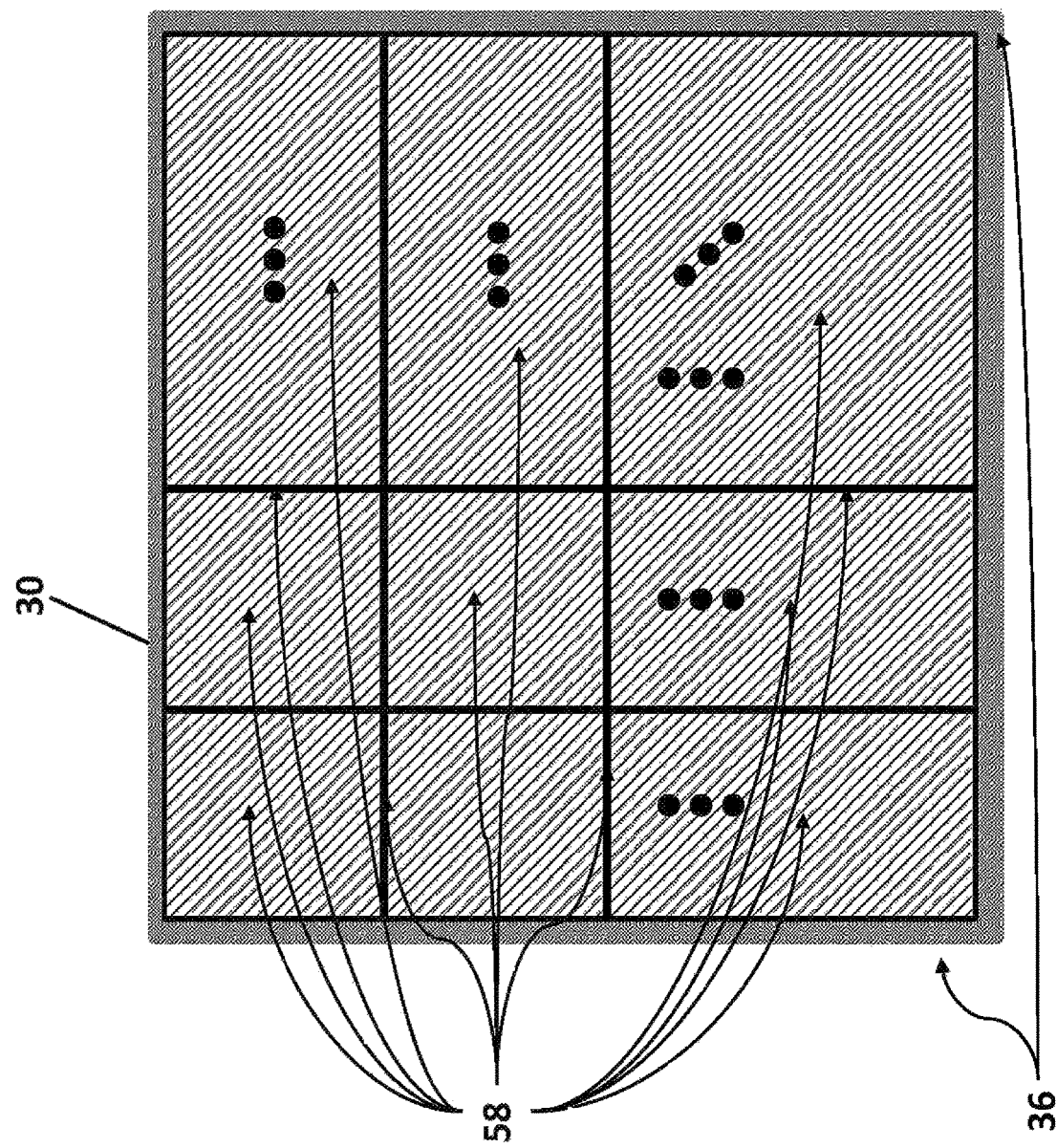
FIG. 10 is a plan view of the ROIC of FIG. 9.

Step 3: Deposition of a Conductive Layer and Subsequent Removal of Excess Photoresist 3.1 As shown in FIGS. 9 and 10, it is at this stage that the now defined areas are exposed to a deposition of a conducting layer 58. Such a layer, as previously mentioned, may be comprised of any combination of metals, substances, or materials which provide conductivity suitable for carrying the electrical signals of electrode grid. One example is the use of an electron-beam deposition chamber in which metals of Ti and Au are deposited with thickness of 20 nm and 300 nm respectively.

Figure 11:
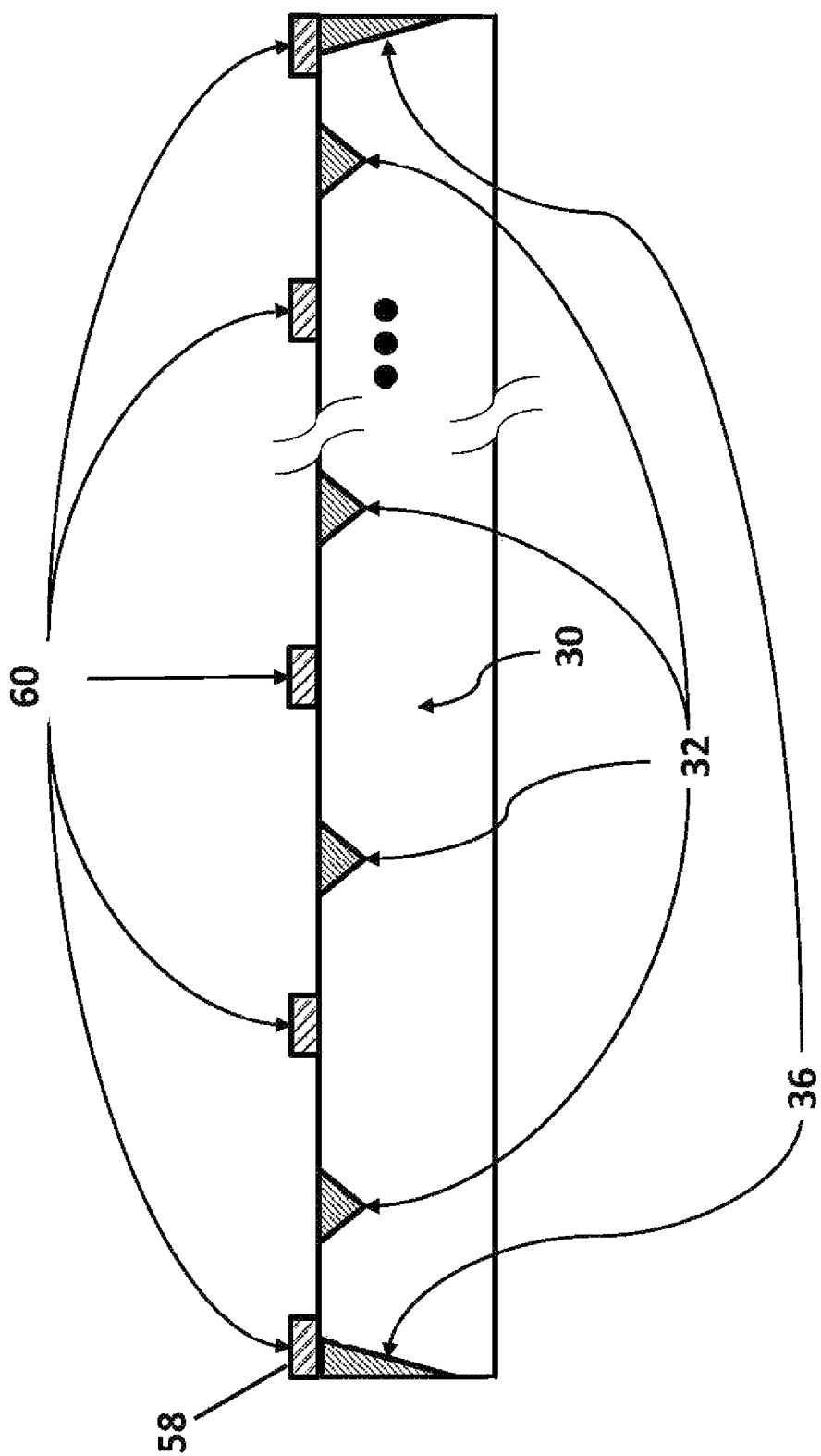
FIG. 11 is a sectional view of the ROIC of FIG. 9 after a fifth step of the exemplary method of the invention.
Figure 12:
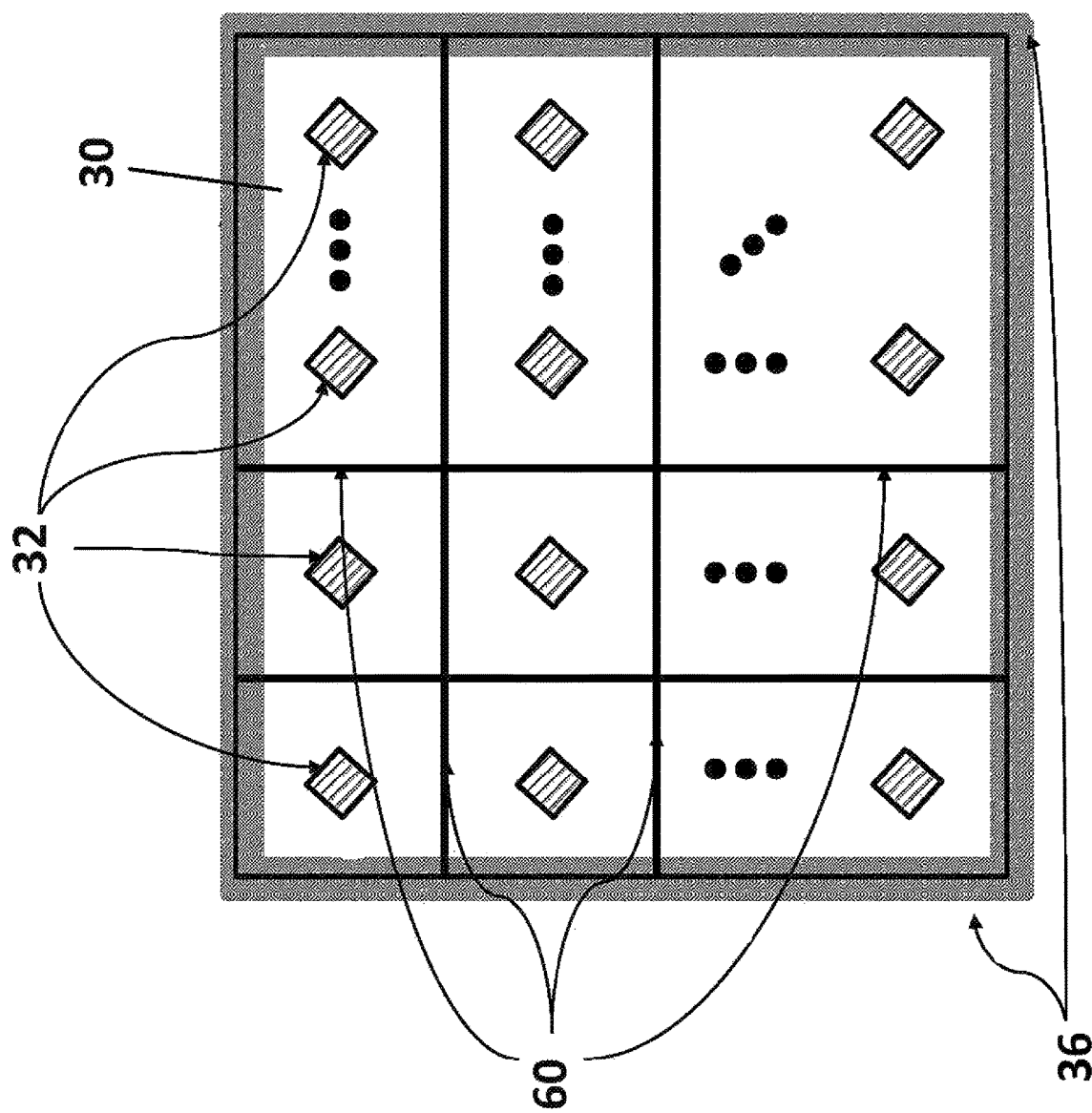
FIG. 12 is a plan view of the ROIC of FIG. 11.

3.2 After deposition of the conducting layer 58, the remaining photoresist 52 and portions of the conducting layer 58 located on the photoresist 52, are removed as shown in FIGS. 11 and 12. This removal re-exposes all previously covered areas of the host ROIC including all electrodes 32, except for the areas covered by the now formed electrode grid 60. One such method of removal is through the use of a constant spray of acetone until the photoresist is removed.

Step 4: Deposition of a Photodetector Film, Such as One Comprised of CQDs

After the electrode grid 60 is formed, the ROIC is suitable for the deposition of a photodetector film 70, such as a CQD film as shown in FIGS. 13 and 14. As previously mentioned, the CQD film may be composed of a variety of chemical compounds or elements, and may be deposited with any method suitable for the formation of the film, including, but not limited to, spin coating, dip coating, drop casting, or printing. In principle, it may be possible to use traditional semiconductor processing techniques, such as ion implantation, metallization or dry etching, as examples, to modify the CQD film post-deposition.

With the prepared ROIC 30, which has the photodetector CQD film 70 deposited thereon, the formation into a focal plane array ("FPA") may take place. This method will provide electrical interfacing between the ROIC and external frame-grabbing hardware and the integration of the optical pathway into a full camera system. This further processing may include steps such as deposition of anti-reflection coatings, encapsulation, mounting, or any other process that might be reasonably expected for the integration of an FPA with a camera system.

Example 2

In another embodiment of this invention, the electrode grid may be deposited after the CQD film has been formed, or a second electrode grid may be deposited. In reference to example 1 above, this may be inserted as a new step in the sequence described therein, and performed after the example 1's step 1.1 and prior to example 1's step 1.2. When used as such a front-electrode, the open grid will allow more light to penetrate into the CQD film than a solid, uniform film of conducting material would allow. This is particularly important as the desired wavelength of detection increases beyond 1 micron, and the light is less able to penetrate through the conducting material. In addition, the patterned front-electrode would act to direct electrical signals to the center electrode of each pixel (electrode 32), reducing cross-talk. The CQD film must be opened to allow the subsequently deposited front-electrode to contact the common electrode contacts on the ROIC, and this opening may be accomplished through any lithograph, masking, patterning or removal process that is compatible with the ROIC and the CQD film. The use of a grid-style front electrode may help to collect more charge carriers from a thick CQD film.

Example 3

In another embodiment of this invention, the ROIC would be made nearly atomically flat using chemical-mechanical planarization techniques known collectively as planarizing, prior to the deposition of the electrode grid or CQD film followed by the electrode grid. This planarization may first involve the deposition of additional insulating material, possibly chosen to act as a back electromagnetic radiation reflector to enhance the overall radiation absorption within the CQD film. Apart from the formation of a back reflector, planarization may be necessary if the height variation in the surface of the ROIC would lead to an excessively broad image plane, and loss of sharpness.

Example 4

Step 1: Definition of Electrode Areas Via Photolithography 1.1 A ROIC 30 is provided as a starting workpiece, configured as shown in FIGS. 1 and 2. The ROIC 30 supports desired electrical behaviors for the photodetector array to which it will be in contact. The ROIC includes pixel electrodes 32 that are spaced over the ROIC in a pattern, such as a grid configuration. The pixel electrodes 32 are signal-connected to circuitry of the ROIC (not shown). The common ground contact 36, shown in the shape of a rectangle, is arranged around an outer perimeter of the ROIC 30. The common contact 36, which may be a ground contact, is signal-connected to circuitry of the ROIC (not shown). The ROIC 30 first undergoes a cleaning process with suitable solvent chemicals or other methods which strip away contaminants but leave the ROIC undamaged, for example: acetone, methanol, isopropyl alcohol, or the like. Such a contamination clean may also be performed using a plasma etch, or any other technique which leaves the ROIC undamaged.

Figure 15:
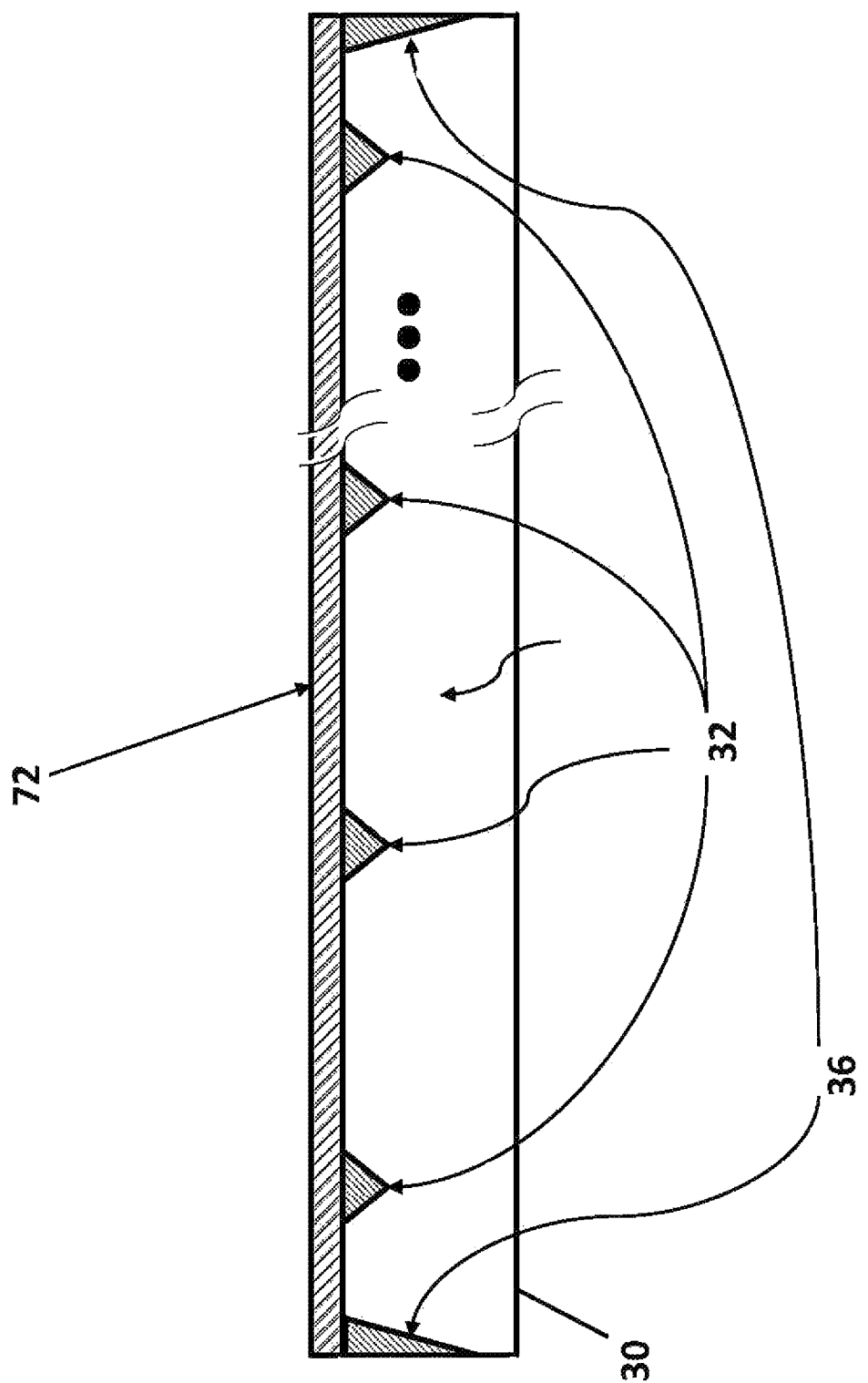
FIG. 15 is a sectional view of the ROIC of FIG. 1 after a first step of an alternate exemplary method of the invention.
Figure 16:
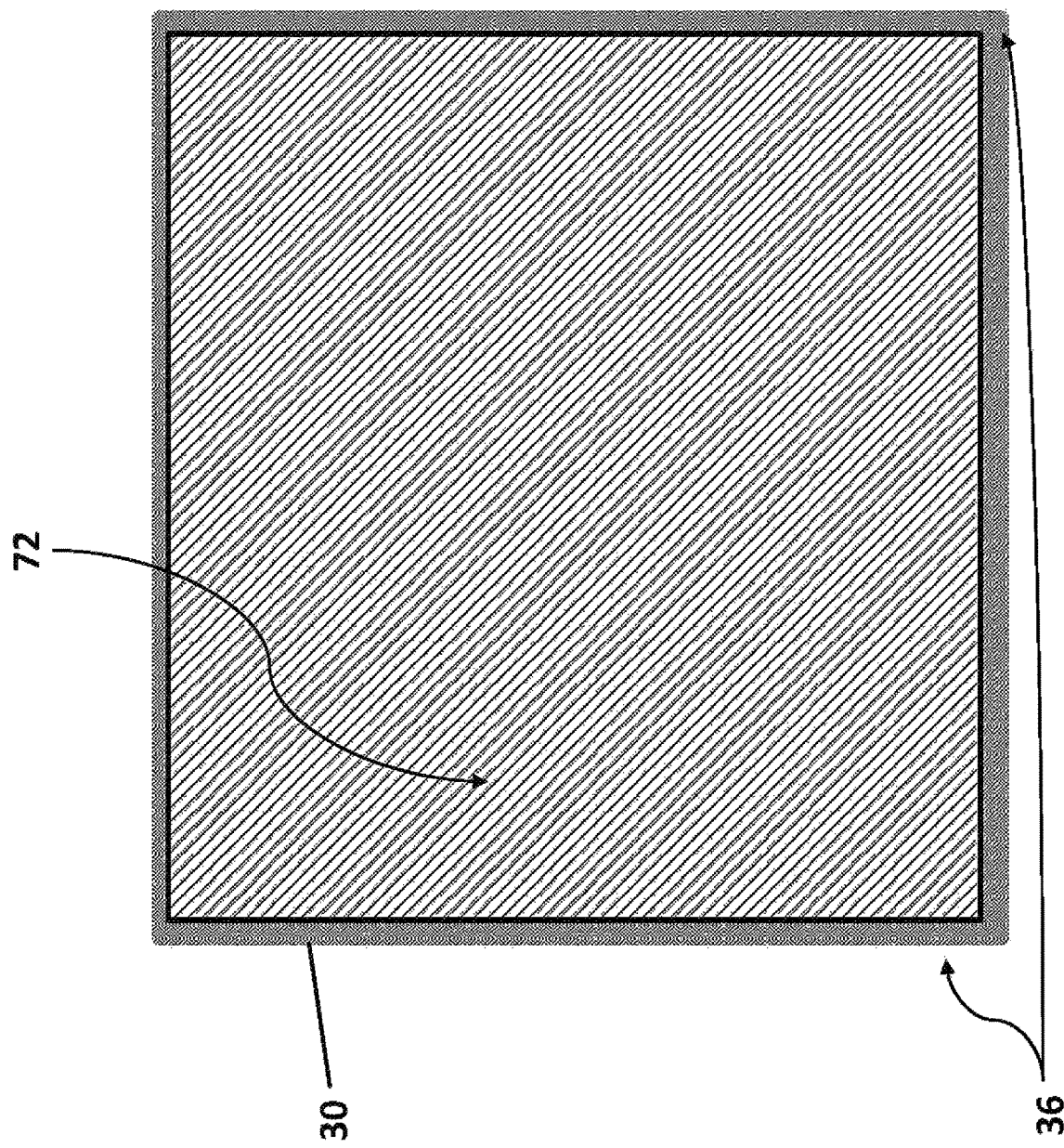
FIG. 16 is a plan view of the ROIC shown in FIG. 15.

1.2 Next, as shown in FIGS. 15 and 16, a conducting layer 72 is deposited on the ROIC. Such a layer, which will be modified, as described below, to form the electrode grid 60, may be comprised of any combination of metals, substances, or materials which provide conductivity suitable for carrying the electrical signals of the electrode grid. One example is the use of an electron-beam deposition chamber in which metals of Ti and Au are deposited with thickness of 20 nm and 300 nm respectively.

Figure 17:
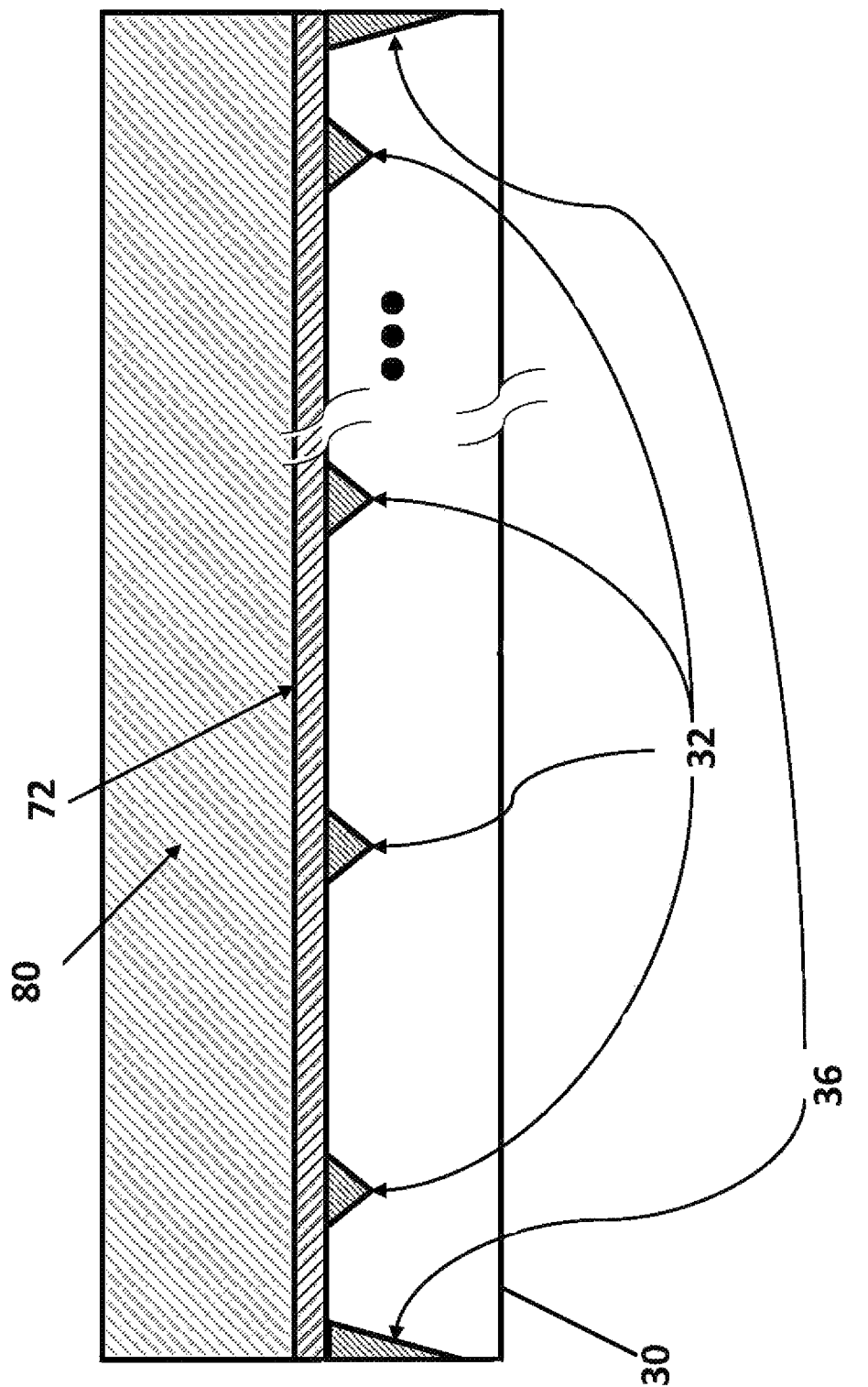
FIG. 17 is a sectional view of the ROIC of FIG. 15 after a second step of the alternate exemplary method of the invention.
Figure 18:
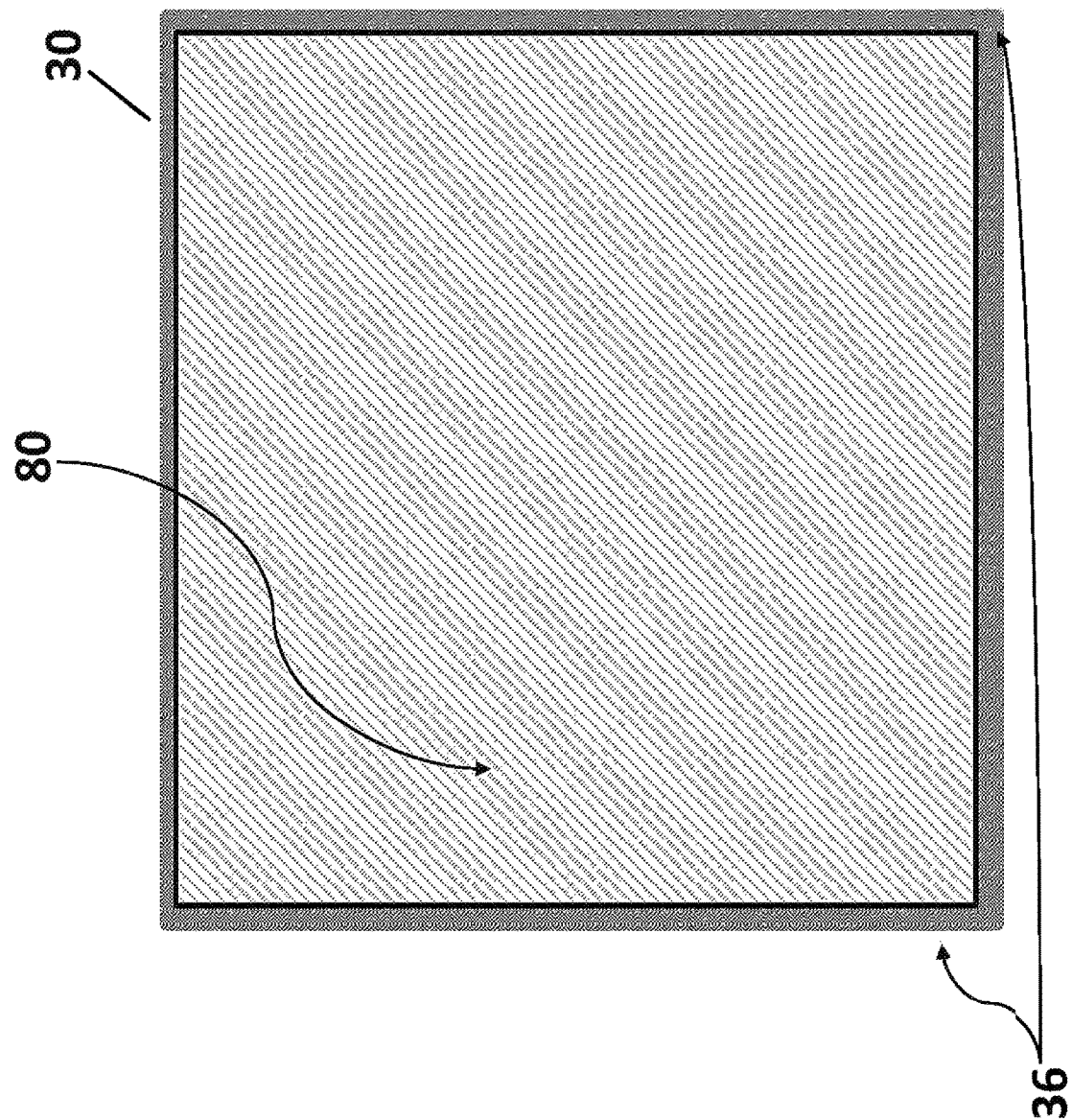
FIG. 18 is a plan view of the ROIC of FIG. 17.

1.3 Next, as shown in FIGS. 17 and 18, a photo-responsive polymer such as a polyimide plastic or positive or negative photoresist, such as NR71, hereafter referred to as the photoresist 80 is deposited uniformly onto the conducting layer 72. Uniform deposition can be performed by using a spin coating at or near 4000 revolutions per minute at or near a 30 second duration while slowly adding the photoresist. Any other technique which deposits such photoresist 80 in a uniform manor would be suitable.

1.4 Next, the ROIC 30 with conducting layer 72 and photoresist 80 can be given a thermal anneal at or near 145° C. at or near a 60 second duration, otherwise known as a 'soft bake'. Other temperatures or durations which prepare the photoresist for light exposure will also be suitable.

Figure 19:
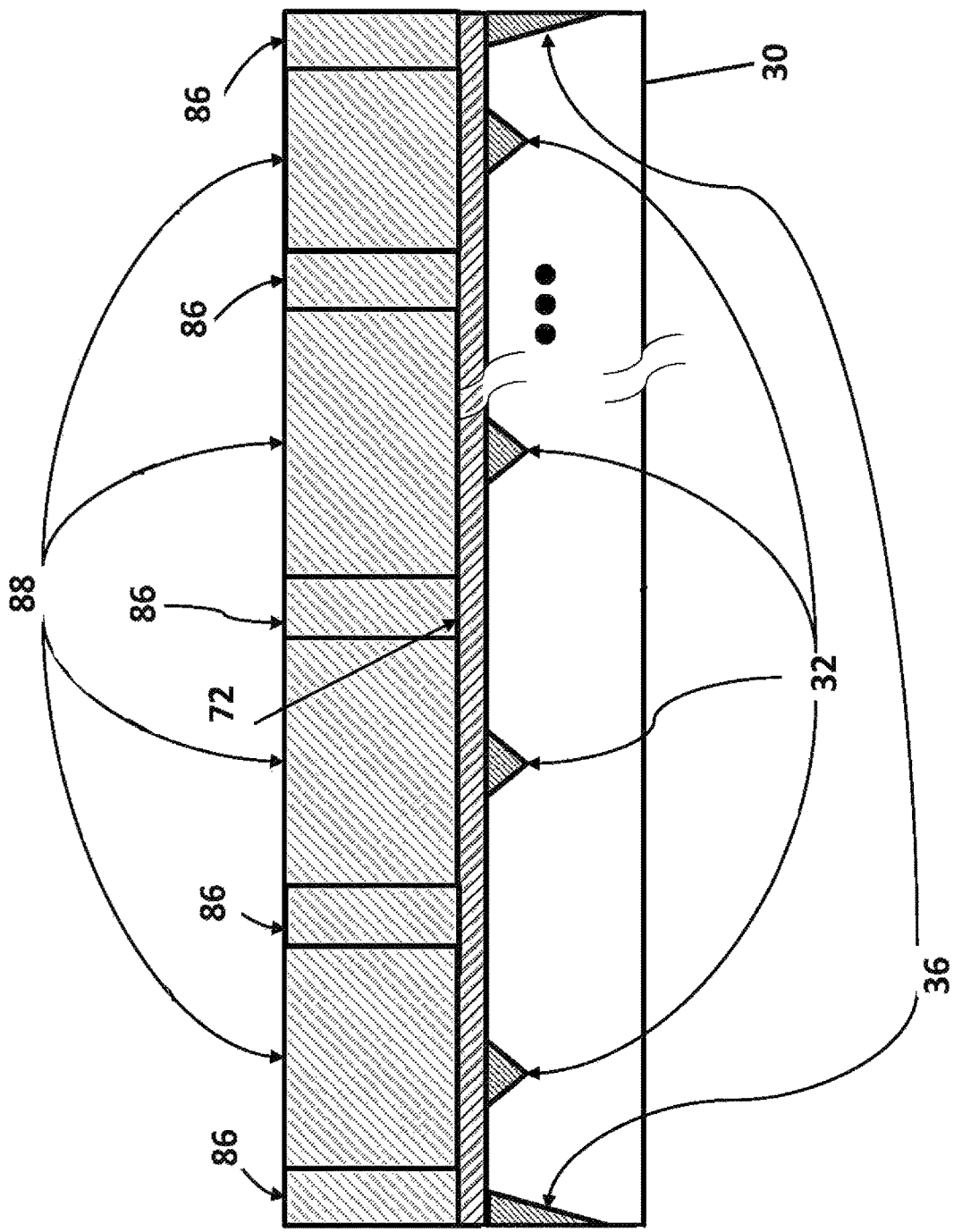
FIG. 19 is a sectional view of the ROIC of FIG. 17 after a third step of the alternate exemplary method of the invention.
Figure 20:
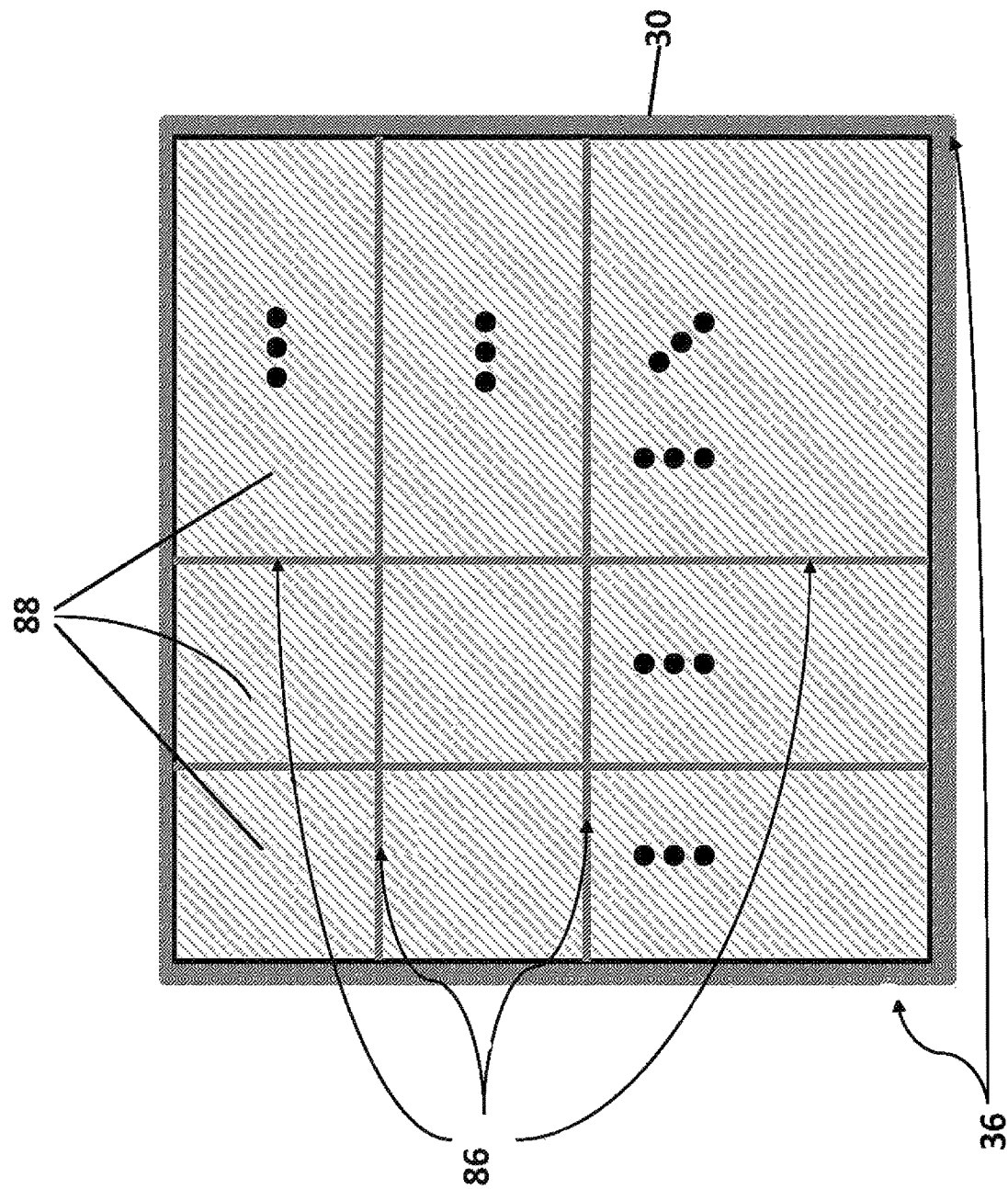
FIG. 20 is a plan view of the ROIC of FIG. 19.

1.5 As described in FIGS. 19 and 20, an appropriate photolithography mask (not shown) is placed in a desired alignment over the photoresist 80. The mask has a pattern to define an electrode grid using the desired geometry, and is matched to the photoresist chosen (positive or negative photoresist). For example: for a grid having square pixels and using negative photoresist, the photo-mask will provide light exposure to a square shape 86 surrounding each pixel electrode 32 without covering the pixel electrode 32, and does not expose a square area 88, within the square shape 86, that covers the pixel electrode 32.

1.6 After alignment on the top surface of the photoresist on ROIC 30, the photolithography mask is placed in close proximity to an ultraviolet light source.

1.7 The photoresist 80 is now prepared for removal and definition depending on the choice for photoresist. For a positive photoresist, the photoresist 80 is exposed to ultraviolet light for a duration at or near 30 seconds. Also, for a negative photoresist, UV exposure for 30 seconds will strengthen the polymers exposed, such as in the square grid areas 86, allowing the unexposed areas 88 to be safely removed in subsequent steps.

1.8 After preparation of the photoresist through exposure additional preparation steps will be undertaken specific to the photoresist chosen. The host ROIC 30, the conductive layer 72 and the photoresist 80 are given a second thermal anneal similar to step 1.4, now at a temperature at or near 100° C. and at or near 60 second duration, known as a "hard bake."

Step 2: Development of Electrode Areas Via Etching.

Figure 21:
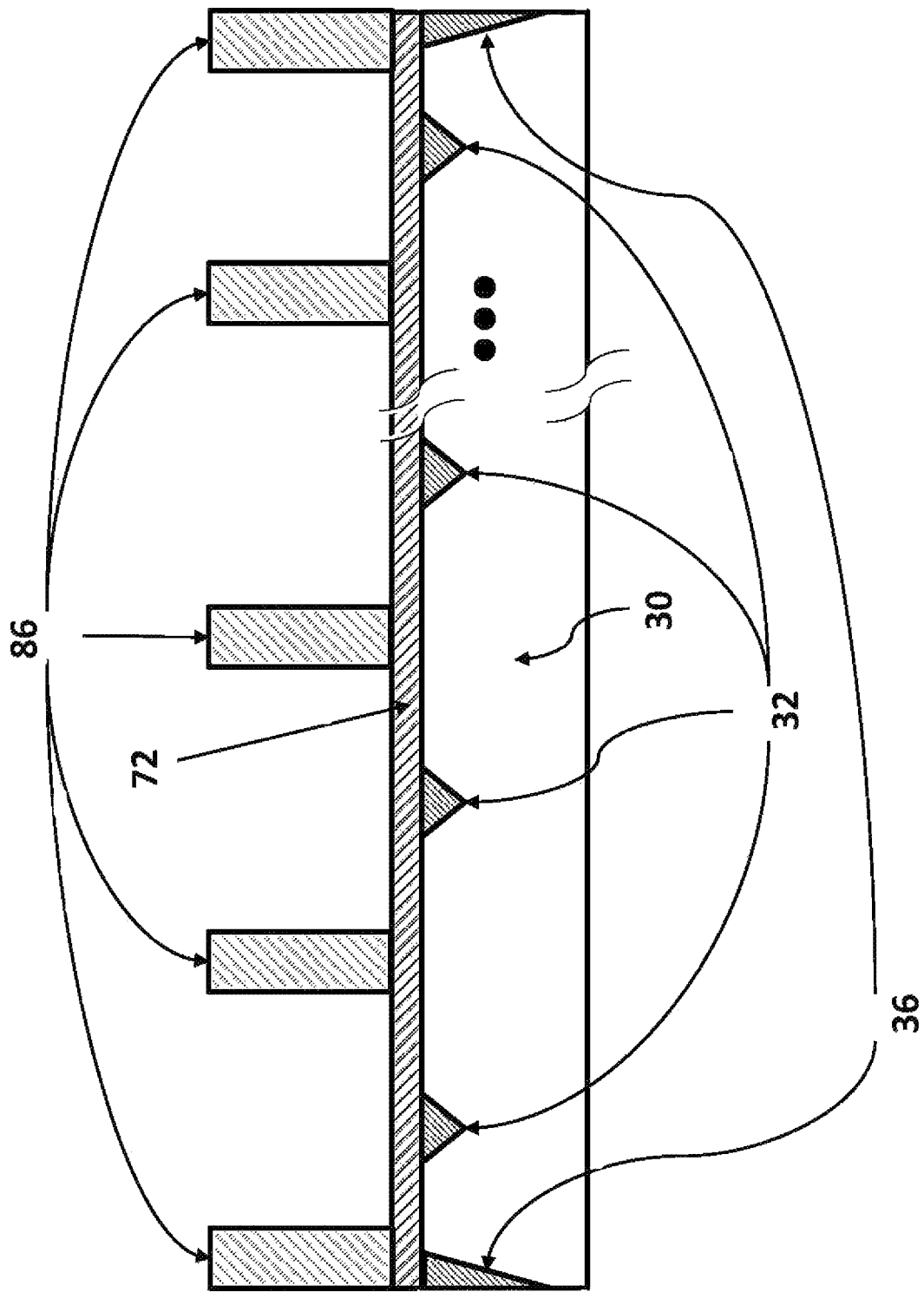
FIG. 21 is a sectional view of the ROIC of FIG. 19 after a fourth step of the alternate exemplary method of the invention.
Figure 22:
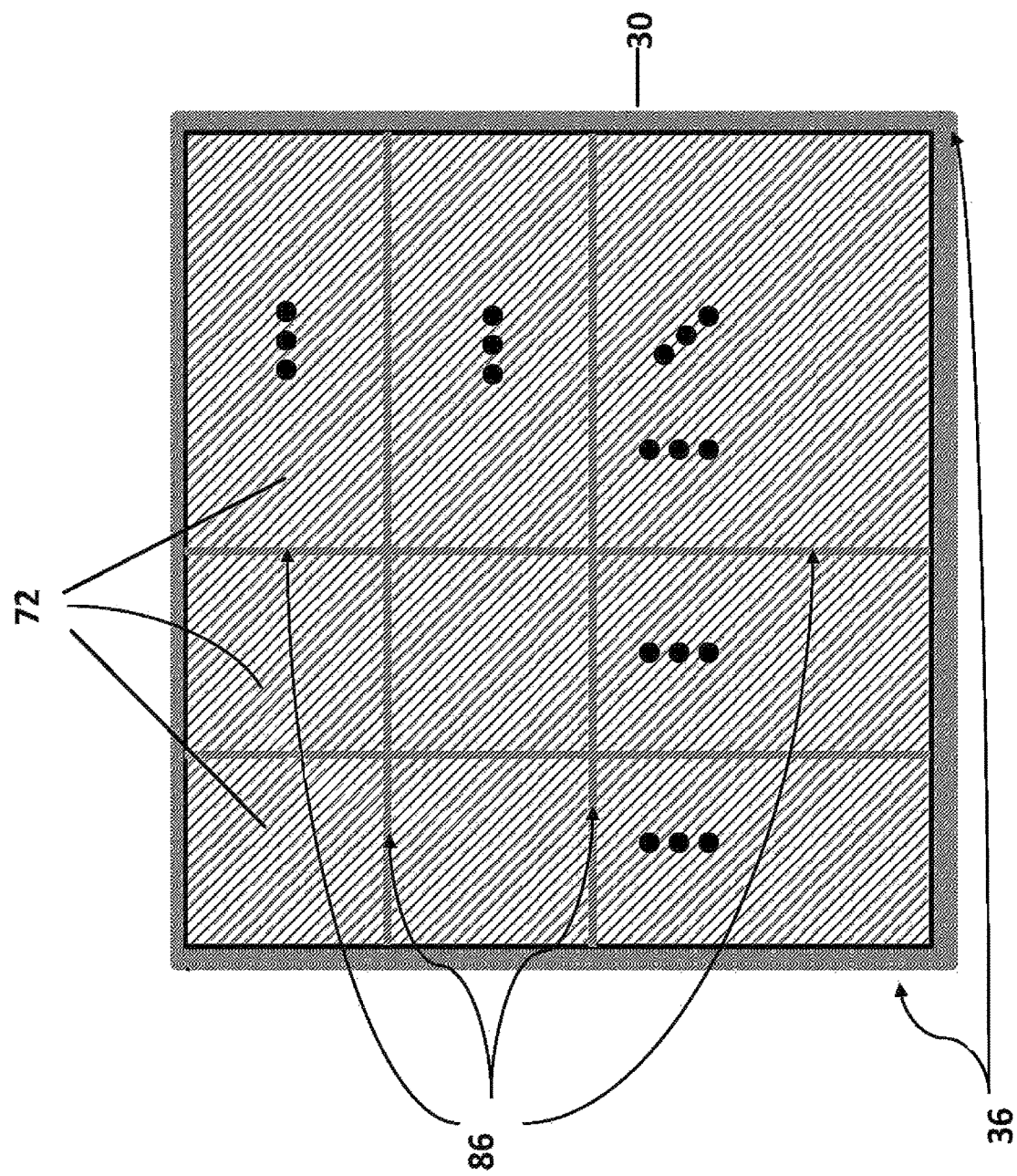
FIG. 22 is a plan view of the ROIC of FIG. 21.

2.1 Next the chosen photoresist is developed. The prepared host ROIC from Step 1 is immersed completely in a suitable development solution such as RD6 for a duration at or near 60 seconds or until such time as the photoresist is fully developed. As shown in FIGS. 21 and 22, this removes the unexposed areas 88 of the photoresist. The remaining exposed areas define the areas of the electrode grid 60.

Figure 23:
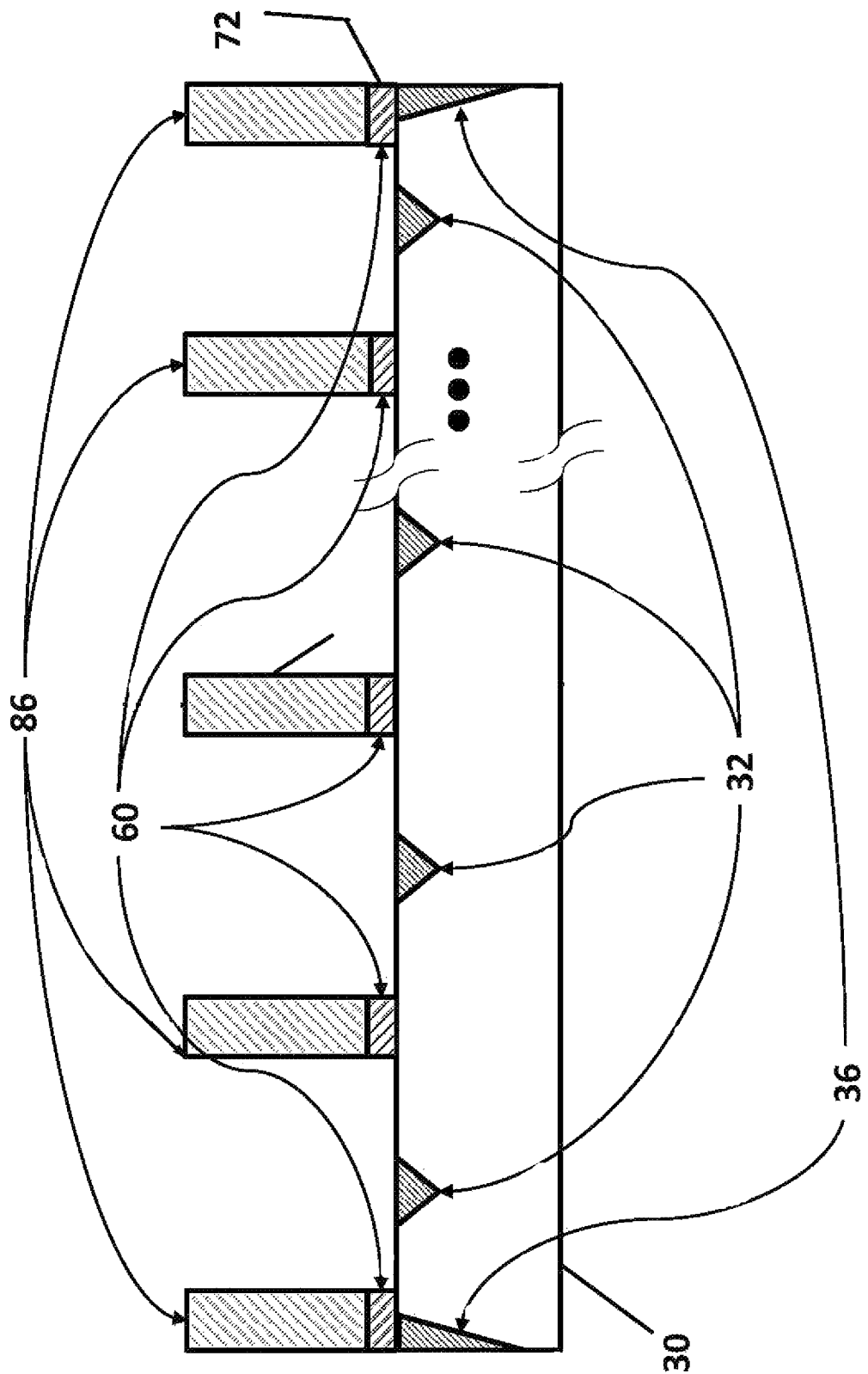
FIG. 23 is a sectional view of the ROIC of FIG. 21 after a fifth step of the exemplary method of the invention.
Figure 24:
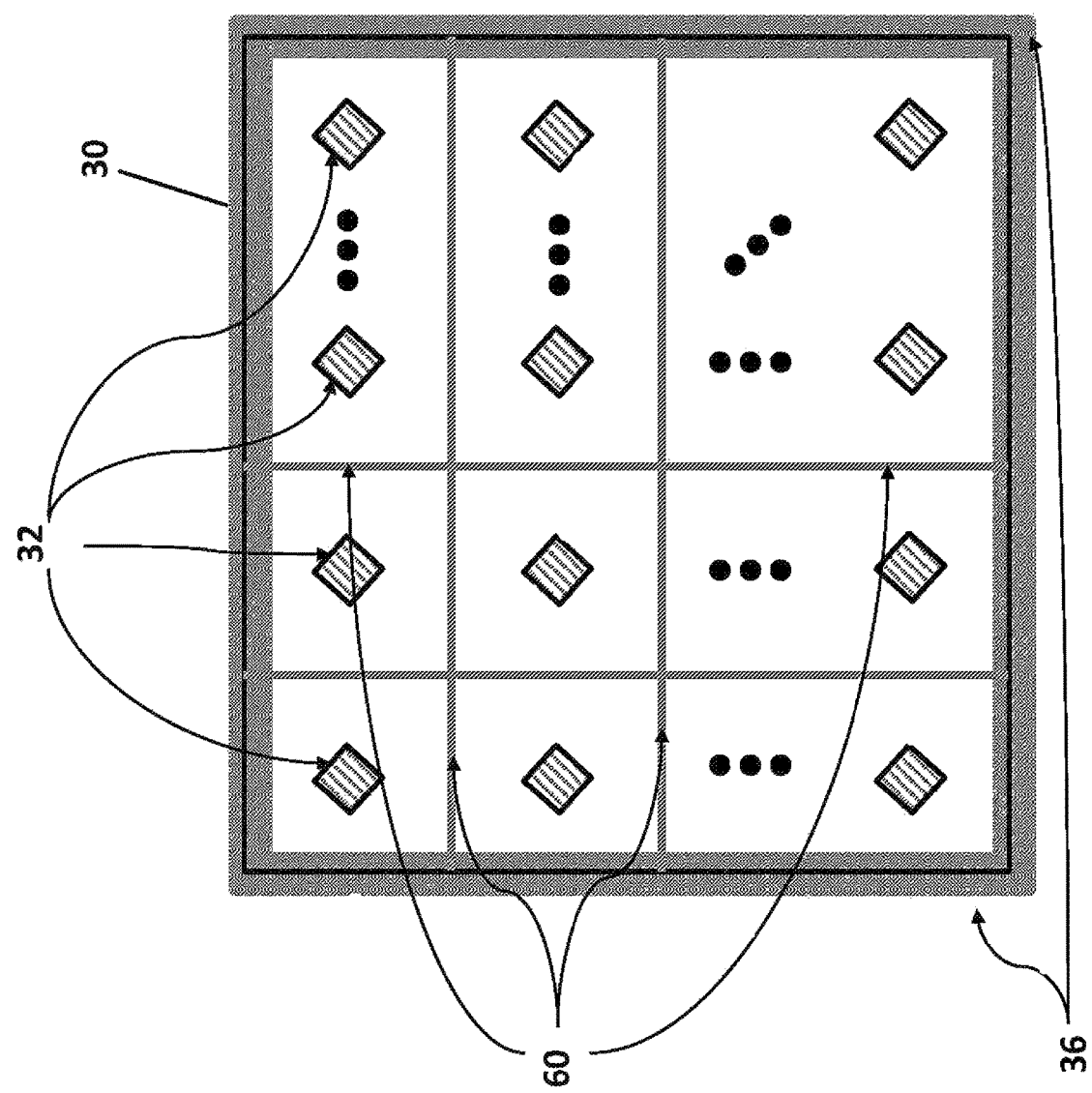
FIG. 24 is a plan view of the ROIC of FIG. 23.

2.2 Taking the prepared host ROIC from Step 2.1, as shown in FIGS. 23 and 24, the ROIC is etched to remove the conductive layer within the square areas that cover the pixel electrodes 32. The process should be controlled so as to not etch into the pixel electrodes 32. The conductive layer areas that are beneath the exposed negative photoresist 86 are shielded from etching by the photoresist 86 and remain in place.

2.3 Two pure de-ionized water solutions are prepared, and the host ROIC is immersed within the first solution and may be lightly agitated. Then it is transferred to the second de-ionized water solution and again lightly agitated, providing a cleaning process.

2.4 After cleaning, the host ROIC is dried through flowing gaseous nitrogen of suitable purity to avoid contamination over the sample until excess liquid has been removed. Any such process to remove unwanted and excess water may be used here providing that the host ROIC is not damaged, nor the defined areas from previous steps removed.

2.5 The host ROIC is now optionally inspected for damage and proper exposure. It is at this stage combinations of any previous steps may be performed following any re-processing or chemical etching to removed unwanted areas.

Step 3: Removal of Excess Photoresist

Figure 25:
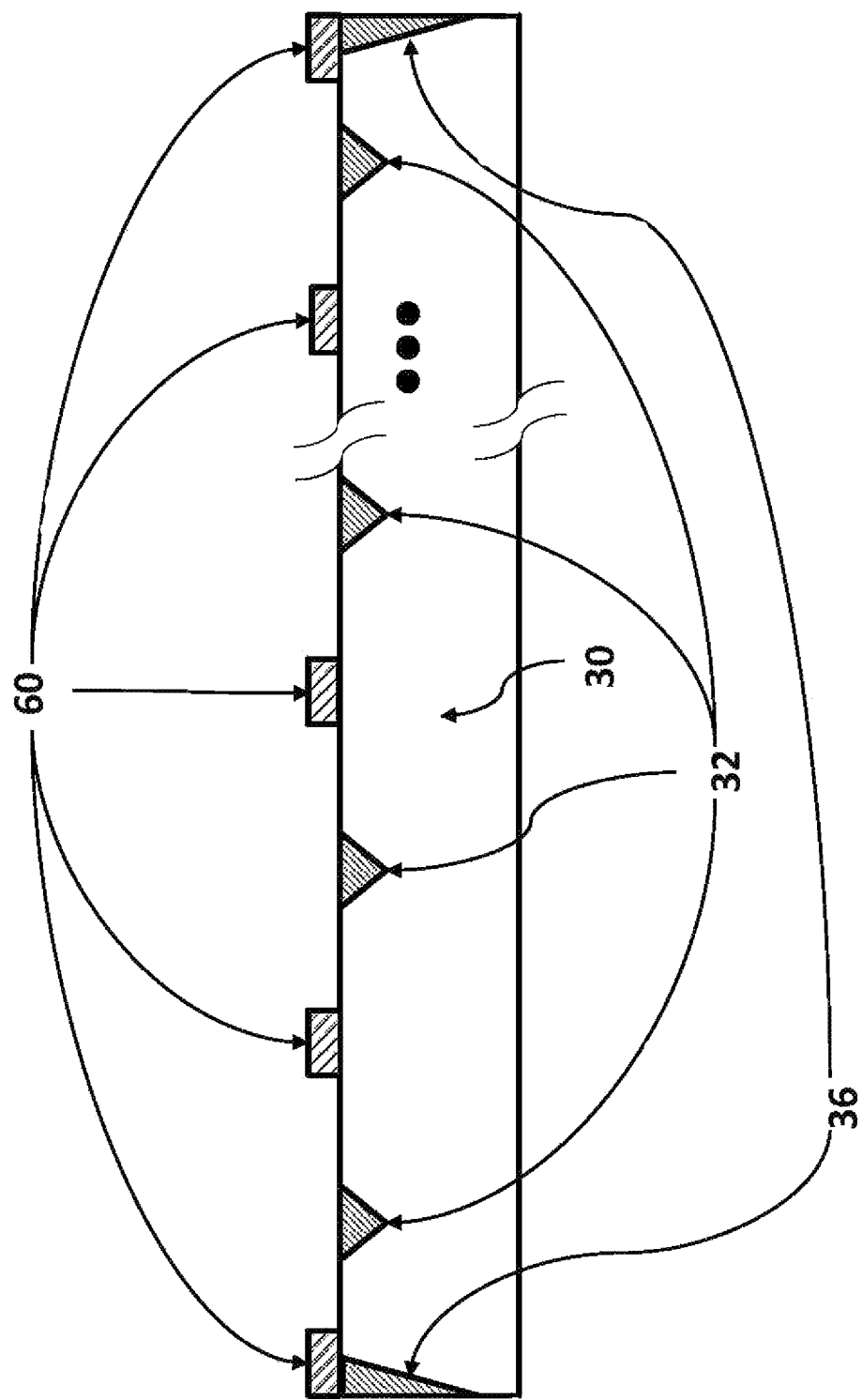
FIG. 25 is a sectional view of the ROIC of FIG. 23 after a sixth step of the exemplary method of the invention.
Figure 26:
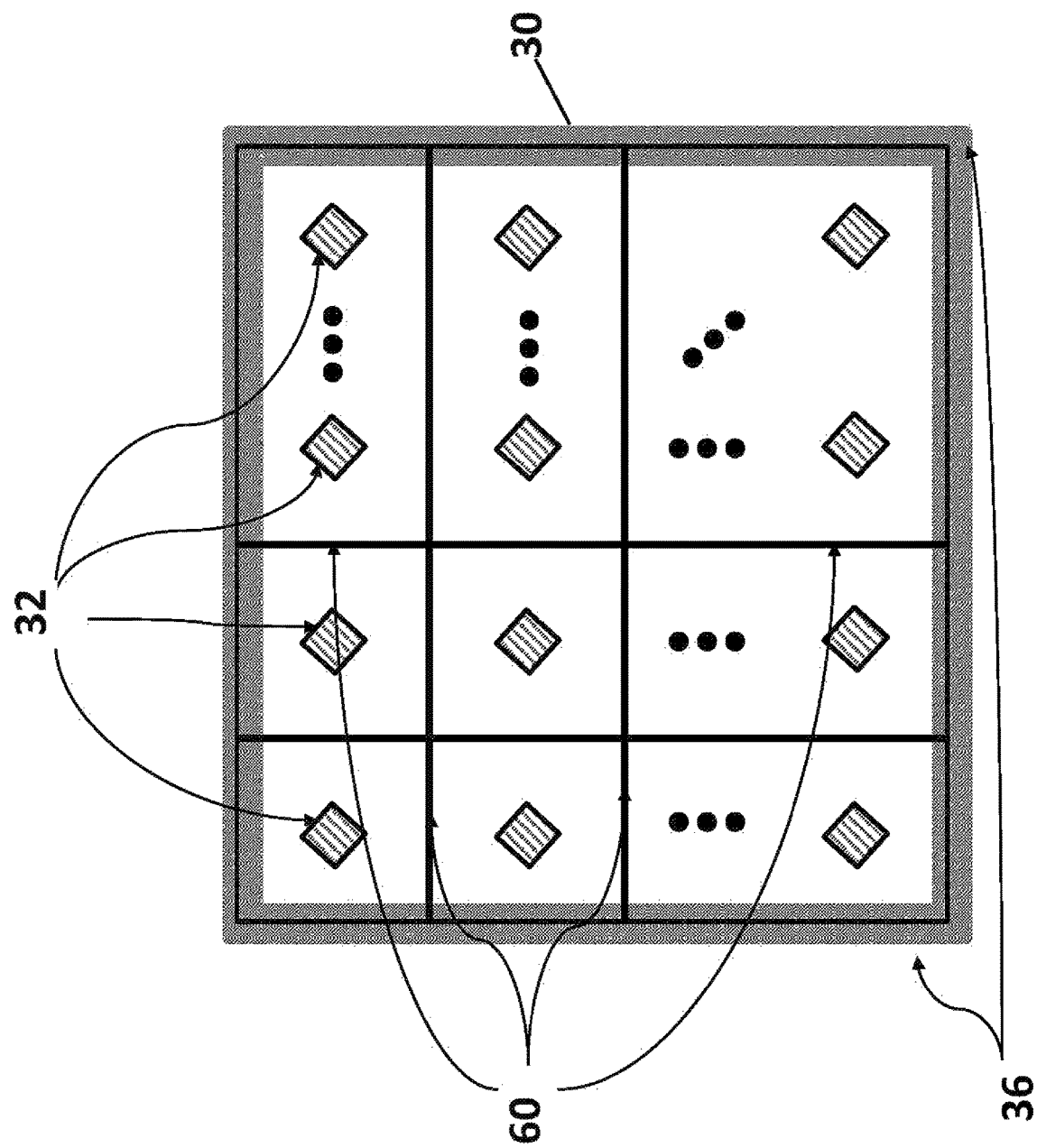
FIG. 26 is a plan view of the ROIC of FIG. 25.

The remaining photoresist 86 can be removed as shown in FIGS. 25 and 26. One such method of removal is through the use of a constant spray of acetone until photoresist is removed. This step is optional in that leaving the photoresist, if compatible with the subsequent film deposition, could provide savings and additional isolation.

It is at this stage that the electrode grid 60 is finished and the ROIC is suitable for the deposition of a photodetector film 70 as shown in in FIGS. 13 and 14, such as a CQD film. As previously mentioned, the CQD film may be composed of a variety of chemical compounds or elements, and may be deposited with any method suitable for the formation of the film, including, but not limited to, spin coating, dip coating, drop casting, or printing. In principle, it may be possible to use traditional semiconductor processing techniques, such as ion implantation, metallization or dry etching, as examples, to modify the CQD film post-deposition.

With the prepared ROIC 30, which has the photodetector CQD film 70 deposited thereon, the formation into a focal plane array ("FPA") may take place. This method will provide electrical interfacing between the ROIC and external frame-grabbing hardware and the integration of the optical pathway into a full camera system. This further processing may include steps such as deposition of anti-reflection coatings, encapsulation, mounting, or any other process that might be reasonably expected for the integration of an FPA with a camera system.

The exemplary embodiment of the invention provides an electrode which:

is electrically conductive, such as made from metals, or metal alloys including gold, copper, titanium, indium tin oxide or any substance, material or combination of materials which is suitably conductive for carrying electrical signals from the photodetector film;

causes no underlying damage to the host ROIC to be used for extraction of electrical signals; and will not react with or interfere with the operation of the photoconductive film which will be subsequently deposited upon and near the electrode(s).

can be located in close proximity on the order of the pixel pitch of the host ROIC to the electrical contacts for each pixel on the host ROIC;

can be patterned into a geometry commensurate with the host ROIC including but not limited to a square grid, stripes, rings, hexagons, or other shapes provided that they are near each electrical contact on the host ROIC;

can be in electrical contact with the common electrical contact provided by the host ROIC, which can provide two electrical contact terminals with which an applied electrical bias voltage may be generated;

provides pixel delineation in which signals generated from electromagnetic radiation that is intercepted by a photoconductive film in proximity to pixel electrodes, is collected by that pixels electrode primarily; and allows for ready deposition and monolithic integration of a photoconductive film such as CQDs directly upon the electrode pattern which would then form a focal plane array.

The exemplary methods of the invention define the electrode areas through steps of:

host ROIC preparation and cleaning including but not limited to the use of solvents, plasma etches, thermal etches, or other methods to remove contaminants from host ROICs prior to further processing;

definition of electrode areas involving any combination of photolithography techniques including but not limited to positive or negative photoresist, image reversal, alignment, post deposition thermal treatments, and light exposure settings which may involve the use of developing solutions;

photomask development which will produce the required geometry, and be within the tolerance and support of related photolithography techniques or other object definition methods; and any number of required thermal anneals before or after any previously required step as needed to properly define electrode areas.

The methods can include deposition of the conductive substance within the defined areas which conforms to the requirements through:

material deposition, including electron-beam deposition, of one, two, or more layers of possible conductive substances; and removal and lift off of residual and excess photo-reactive polymers or pattern defining material or any other processing-related contaminant not needed for device operation.

From the foregoing it will be observed that numerous variations and modifications may be effected without departing from the spirit and scope of the invention. It is to be understood that no limitation with respect to the specific apparatus illustrated herein is intended or should be inferred.

What is claimed is:

1. A method of making a photodetector device, comprising the steps of:

providing a substrate with a plurality of electrically-conducting first electrodes arranged in a pattern;

applying a photoresist layer on said substrate, covering the first electrodes;

applying a photolithography mask to the photoresist layer defining exposed areas and non-exposed areas;

exposing the photoresist and the mask to electromagnetic radiation;

removing one of the exposed areas and non-exposed areas of photoresist to define a pattern of removed photoresist areas and remaining photoresist areas;

applying a layer of electrically conductive material to at least the removed photoresist areas to form an electrode grid of electrically conductive material;

removing the remaining photoresist areas; and applying a photodetector film onto the substrate and onto the grid of electrically conductive material.

2. The method according to claim 1, wherein the step of applying a photodetector film is further defined in that the film comprises colloidal quantum dots.

3. The method according to claim 1 wherein the step of providing a substrate is further defined in that the substrate is an ROIC having circuit elements signal-connected to said plurality of first electrodes.

4. The method according to claim 1, wherein said step of exposing the photoresist and the mask to electromagnetic radiation is further defined in that said electromagnetic radiation is UV radiation.

5. A method of making a photodetector device, comprising the steps of:
provide a substrate with a plurality of electrically-conducting first electrodes arranged in a pattern;
applying a layer of electrically conductive material to the substrate covering the plurality of electrically conductive first electrodes;
applying a photoresist layer on said layer of electrically conductive material;
applying a photolithography mask to the photoresist layer defining exposed areas and non-exposed areas;
exposing the photoresist and the mask to electromagnetic radiation;
removing one of the exposed areas and non-exposed areas of photoresist to define a grid of photoresist and removed photoresist areas;
removing the layer of electrically conductive material in the areas exposed by the removed photoresist areas while maintaining said first electrodes; and
applying a photodetector film onto the substrate and onto the grid of electrically conductive material.

6. The method according to claim 5, wherein after the step of removing the layer of electrically conductive material in the areas exposed by the removed photoresist areas, and before the step of applying a photodetector film onto the substrate and onto the grid of electrically conductive material, performing the step of removing the grid of photoresist to expose a grid of electrically conductive material.

7. The method according to claim 5, wherein the step of applying a photodetector film is further defined in that the film comprises colloidal quantum dots.

8. The method according to claim 5 wherein the step of providing a substrate is further defined in that the substrate is an ROIC having circuit elements signal-connected to said plurality of first electrodes.

9. The method according to claim 5, wherein said step of exposing the photoresist and the mask to electromagnetic radiation is further defined in that said electromagnetic radiation is UV radiation.

* * * * *